United States Patent
Ji et al.

(10) Patent No.: US 8,728,850 B2
(45) Date of Patent: May 20, 2014

(54) PHOTODETECTOR STRUCTURE AND METHOD OF MANUFACTURING THE SAME

(75) Inventors: Ho-Chul Ji, Yongin-si (KR); Kyoung Won Na, Seoul (KR); Kyoung Ho Ha, Seoul (KR); Pil-Kyu Kang, Anyang-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 189 days.

(21) Appl. No.: 13/191,902

(22) Filed: Jul. 27, 2011

(65) Prior Publication Data

US 2012/0025265 A1 Feb. 2, 2012

(30) Foreign Application Priority Data

Jul. 28, 2010 (KR) .................. 10-2010-0072688

(51) Int. Cl.
*H01L 31/0232* (2006.01)
*H01L 31/028* (2006.01)
*H01L 31/18* (2006.01)

(52) U.S. Cl.
USPC .... 438/72; 438/65; 257/E31.011; 257/E31.023; 257/E33.127

(58) Field of Classification Search
USPC ............... 438/57–98; 257/E31.011–E31.014, 257/E31.023–E31.025, E31.127, E31.128
See application file for complete search history.

(56) References Cited

U.S. PATENT DOCUMENTS

| 5,841,931 | A * | 11/1998 | Foresi et al. .................. 385/131 |
| 6,897,498 | B2 | 5/2005 | Gothoskar et al. |
| 7,037,856 | B1 * | 5/2006 | Maa et al. ...................... 438/758 |
| 7,177,489 | B2 * | 2/2007 | Keyser et al. ..................... 385/1 |
| 7,205,525 | B2 * | 4/2007 | Yasaitis ...................... 250/214.1 |
| 7,217,584 | B2 * | 5/2007 | Yue et al. ......................... 438/31 |
| 2006/0189151 | A1 | 8/2006 | Tweet et al. |
| 2007/0104411 | A1 * | 5/2007 | Ahn et al. ........................ 385/14 |
| 2007/0104441 | A1 * | 5/2007 | Ahn et al. ...................... 385/129 |
| 2007/0116398 | A1 * | 5/2007 | Pan et al. .......................... 385/2 |
| 2010/0330727 | A1 * | 12/2010 | Hill et al. ......................... 438/69 |
| 2011/0012221 | A1 * | 1/2011 | Fujikata et al. ............... 257/458 |
| 2011/0147870 | A1 * | 6/2011 | Ang et al. ..................... 257/432 |
| 2012/0001283 | A1 * | 1/2012 | Assefa et al. ................. 257/431 |

FOREIGN PATENT DOCUMENTS

| JP | 2006-171157 | 6/2006 |
| JP | 2006522465 | 9/2006 |
| KR | 1020060026847 | 3/2006 |

* cited by examiner

*Primary Examiner* — Steven J Fulk
*Assistant Examiner* — Eric Ward
(74) *Attorney, Agent, or Firm* — F. Chau & Associates, LLC

(57) ABSTRACT

A method of manufacturing a photodetector structure is provided. The method includes forming a structural layer by making a trench in a bulk silicon substrate and filling the trench with a cladding material, forming a single-crystallized silicon layer on the structural layer, and forming a germanium layer on the single-crystallized silicon layer.

10 Claims, 25 Drawing Sheets

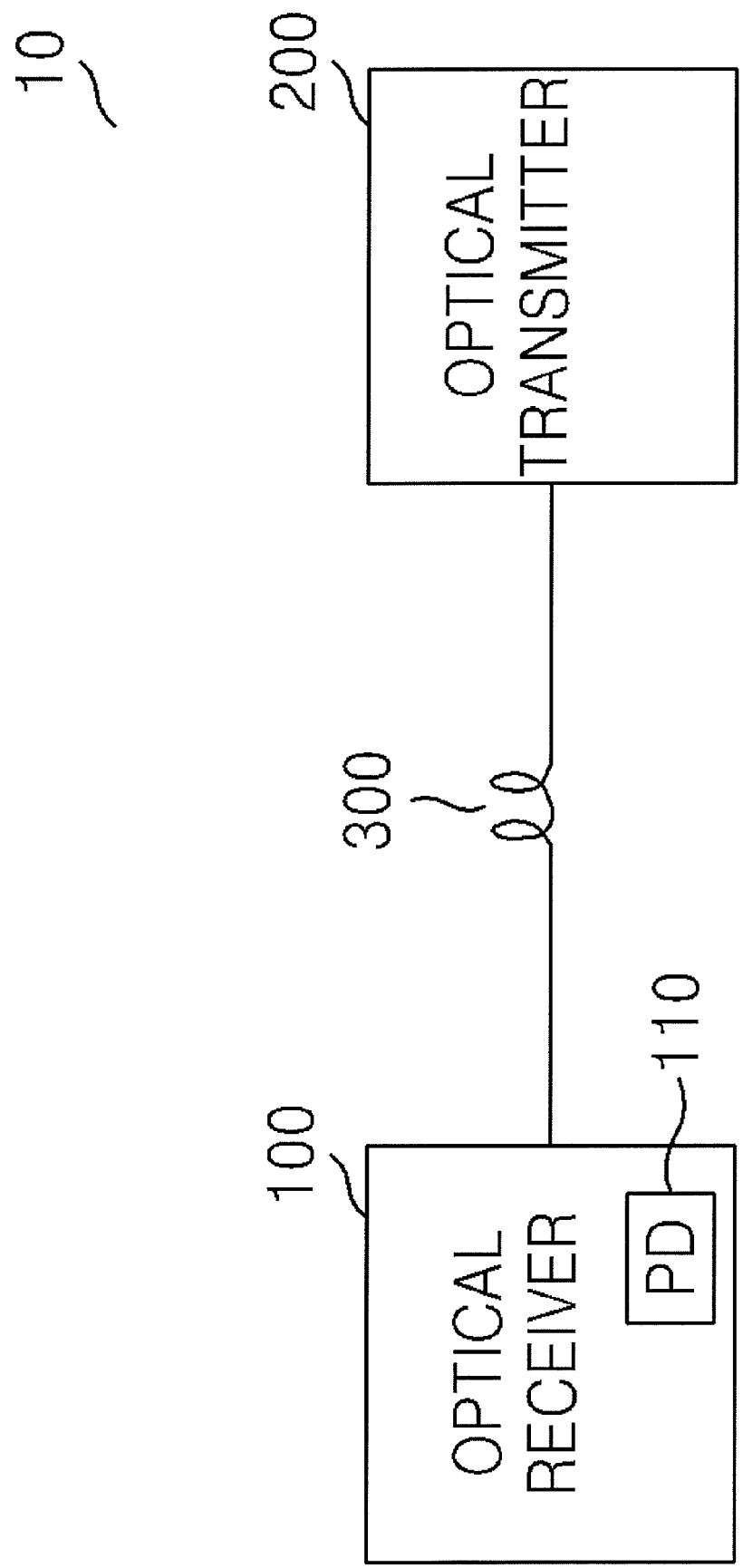

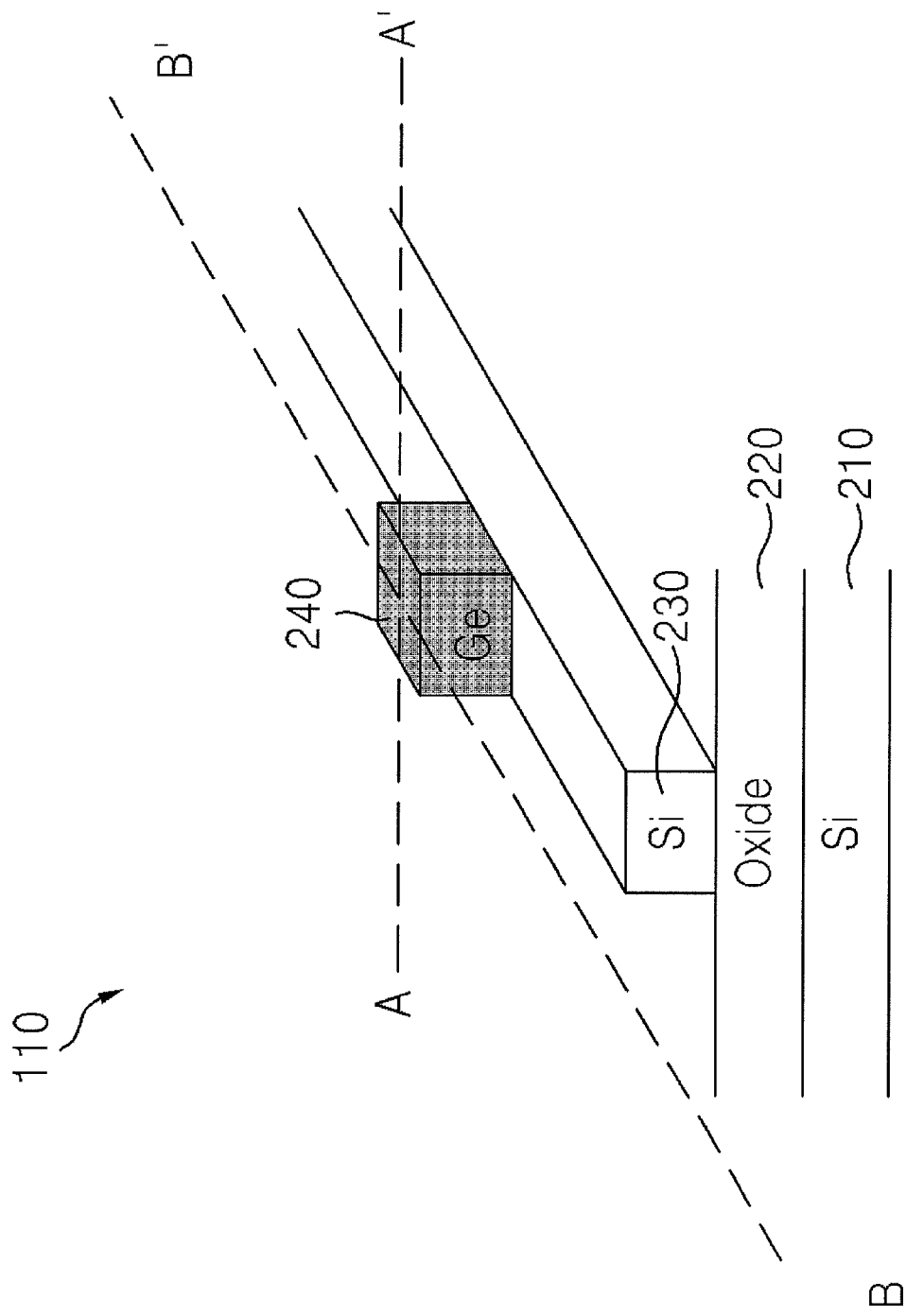

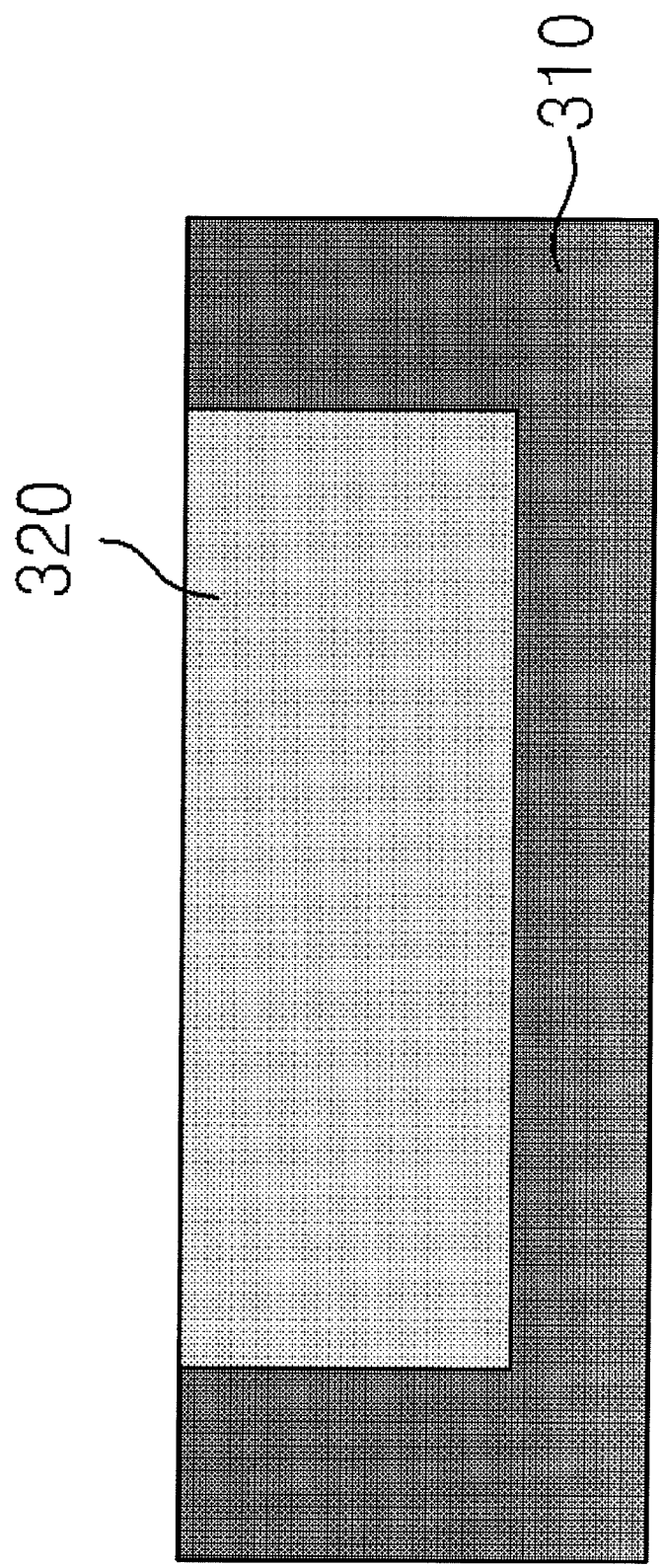

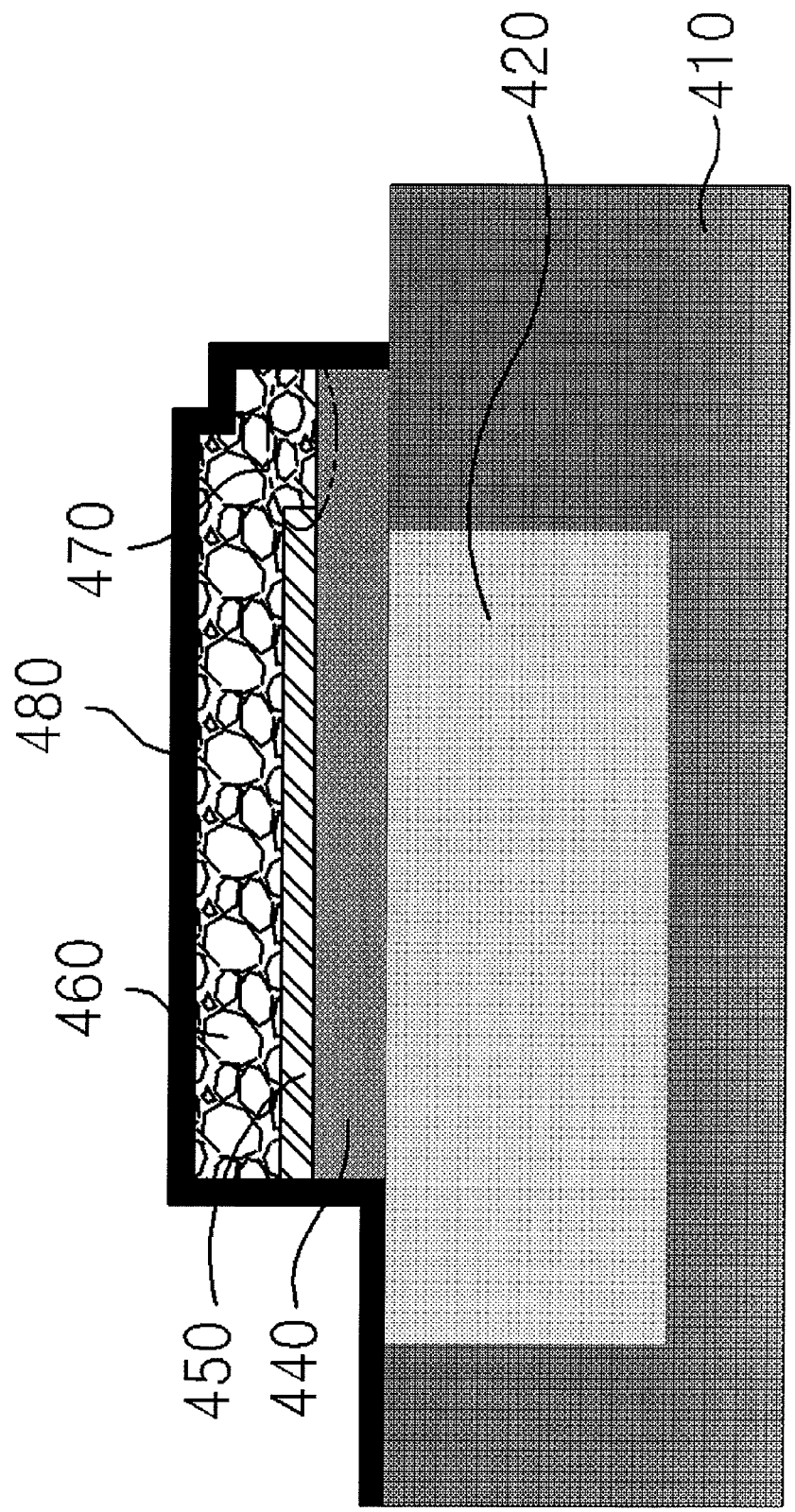

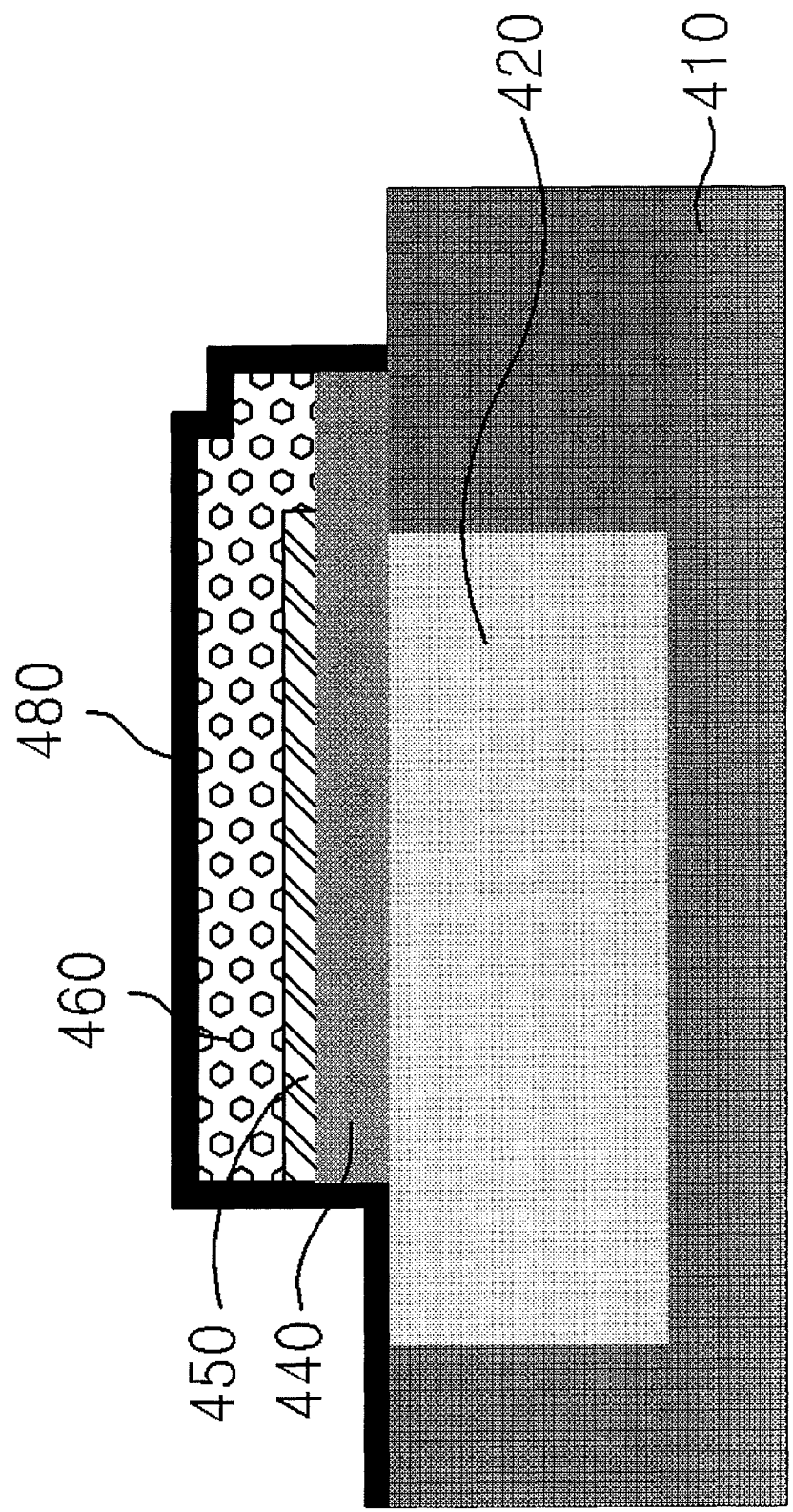

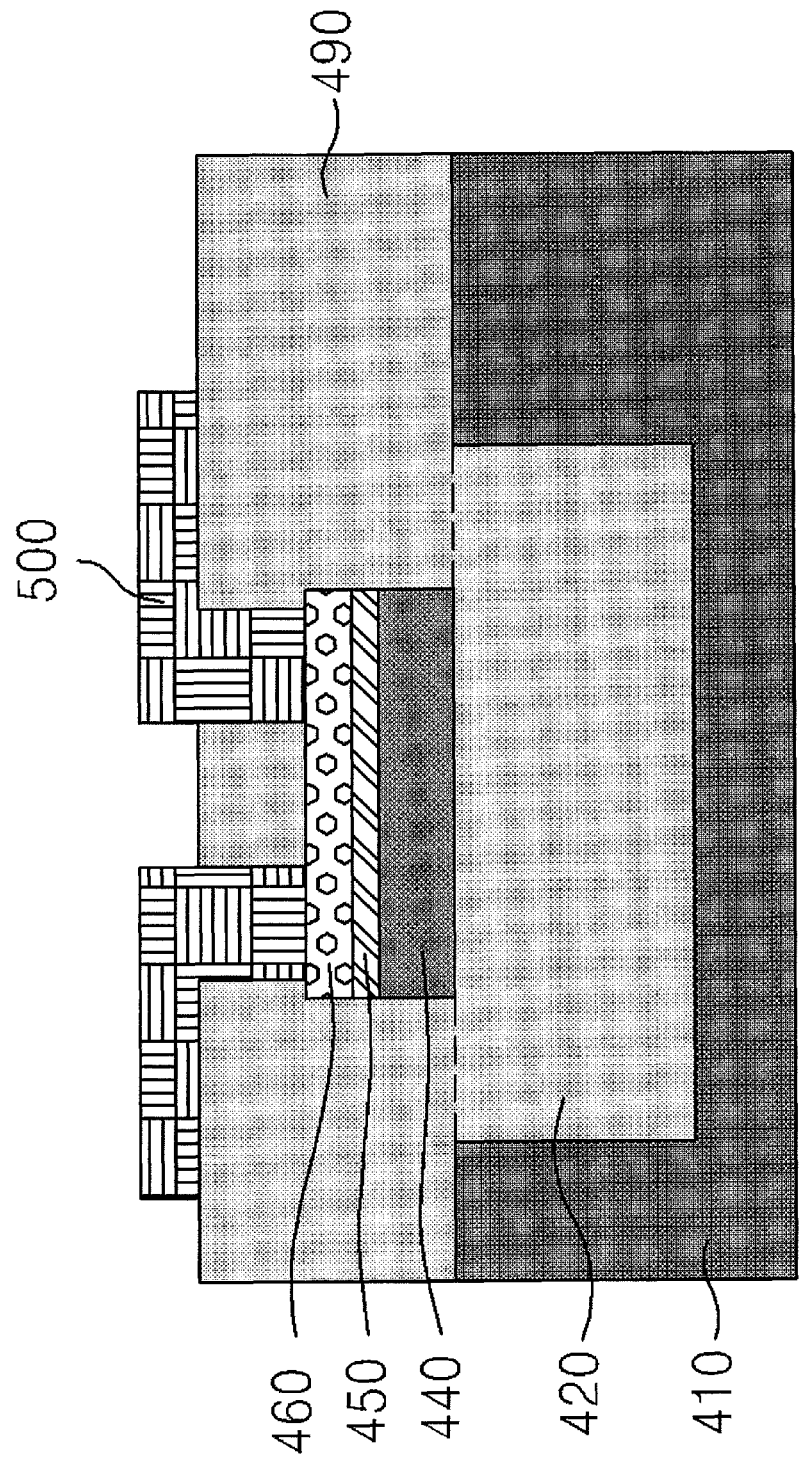

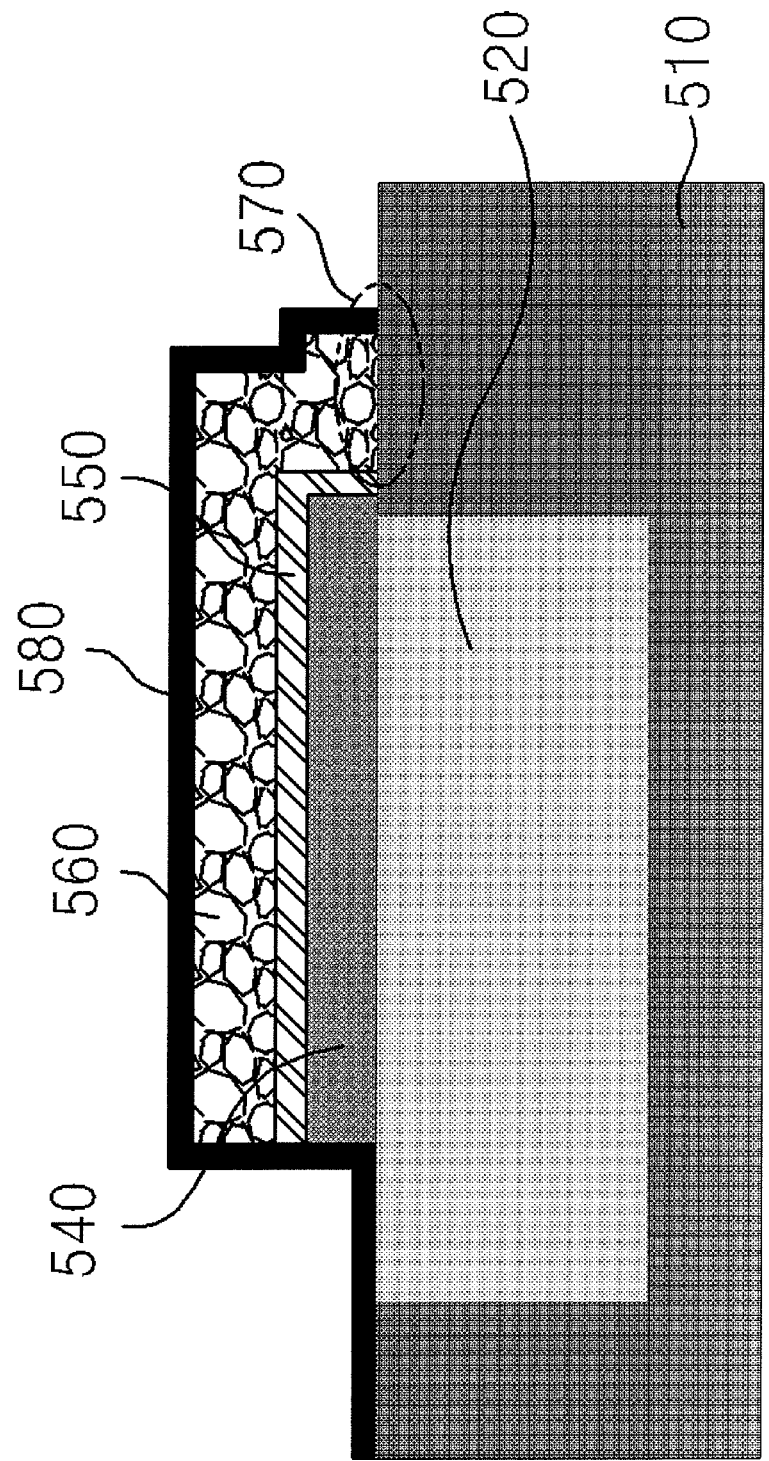

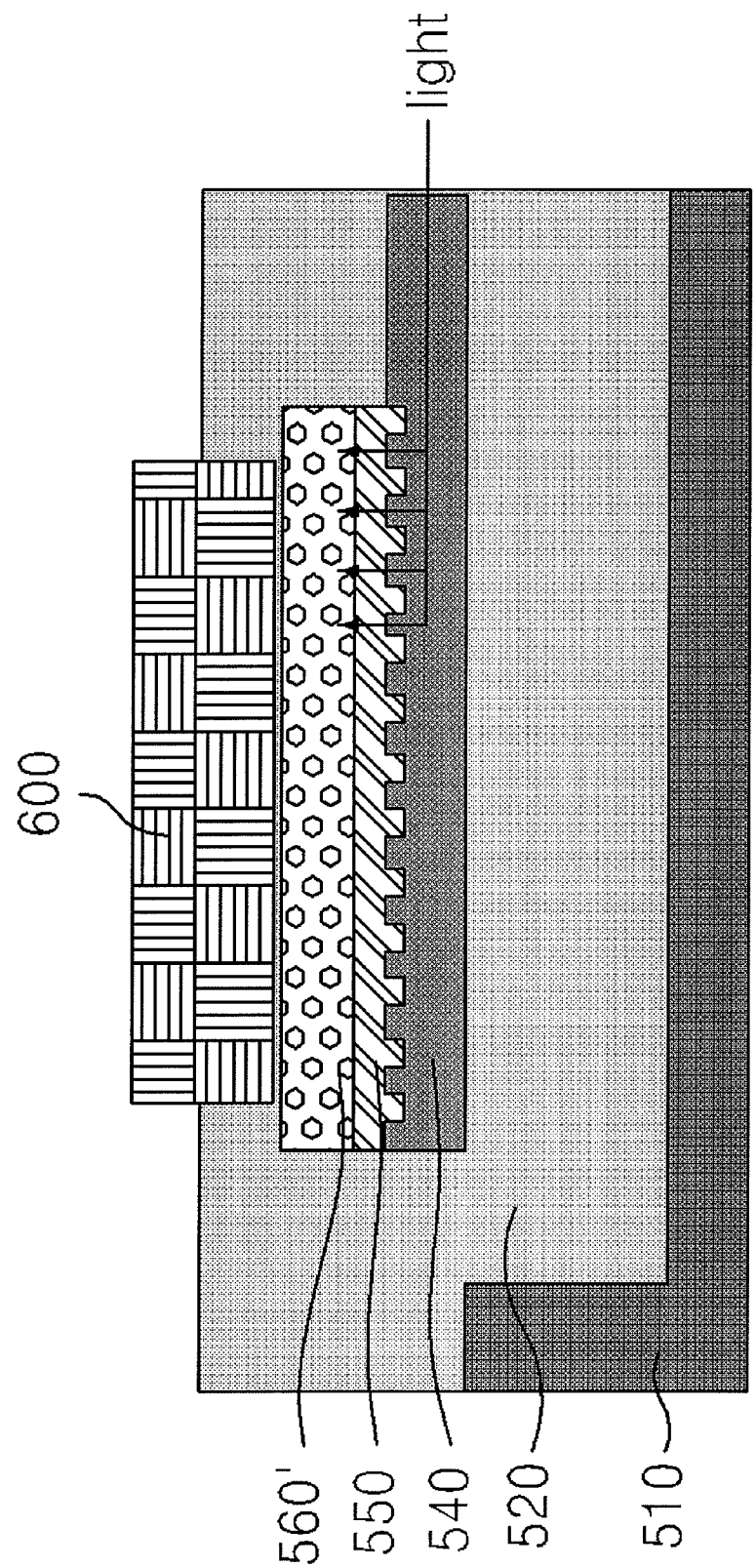

PHOTODETECTOR STRUCTURE AND METHOD OF MANUFACTURING THE SAME

CROSS-REFERENCE TO RELATED APPLICATIONS

This application claims Korean Patent Application No. 10-2010-0072688 filed on Jul. 28, 2010, the disclosure of which is hereby incorporated by reference herein in it's entirety.

BACKGROUND

The present disclosure relates to a photodetector structure and a method of manufacturing the same, and more particularly, to a photodetector structure which can be integrated into a substrate together with a complementary metal-oxide semiconductor (CMOS) integrated circuit (IC), thereby being economical, and a method of manufacturing the same.

Conventionally, methods of growing single-crystals of germanium (Ge) on a single-crystalline silicon (Si) layer using a silicon-on-insulator (SOI) substrate are usually used to manufacture a photodetector which operates at a wavelength band from about 1.3 µm to about 1.5 µm on a Si substrate. Although Si and Ge are all group four elements, since the lattice constant of Ge is about 4% higher than that of Si, misfit dislocation may cause a lot of treading dislocation on a Ge layer. Treading dislocation is the major cause of increasing leakage current and dark current. Methods of performing chemical vapor deposition (CVD) on Ge at a lower temperature and then performing CVD again on Ge at a higher temperature or performing post heat-treatment on Ge are usually used to minimize treading dislocation.

However, there may be significant difficulties and costs associated with lowering treading dislocation density below standard due to the fundamental difference in lattice constant between two materials. Moreover, when the SOI substrate is used, it may not be economical since the SOI substrate may be expensive and the photodetector and CMOS ICs may not be integrated into one substrate.

Thus, there is a need in the art for a photodetector structure which lowers treading dislocation density below standard, can be integrated into one substrate together with a complementary metal-oxide semiconductor (CMOS) integrated circuit (IC), and is economical, and a method of manufacturing the same

SUMMARY

Some embodiments of the present invention provide a photodetector structure which lowers treading dislocation density below standard, can be integrated into one substrate together with a complementary metal-oxide semiconductor (CMOS) integrated circuit (IC), and is economical, and a method of manufacturing the same.

According to some embodiments of the present invention, there is provided a method of manufacturing a photodetector structure. The method includes forming a structural layer by making a trench in a bulk silicon substrate and filling the trench with a cladding material, forming a single-crystallized silicon layer on the structural layer, and forming a germanium layer on the single-crystallized silicon layer.

The forming the germanium layer may include forming a first insulating layer on the single-crystallized silicon layer and forming the germanium layer on the first insulating layer.

The method may further include etching the single-crystallized silicon layer before forming the first insulating layer on the single-crystallized silicon layer. The etched single-crystallized silicon layer may partially contact the bulk silicon substrate of the structural layer.

The method may further include forming a seed window by partially etching the first insulating layer to expose the single-crystallized silicon layer contacting the bulk silicon substrate after forming the first insulating layer.

Alternatively, the method may further include forming a window by partially etching the first insulating layer to expose the bulk silicon substrate after forming the first insulating layer.

The method may further include forming a second insulating layer on the germanium layer and connecting an electrode to the germanium layer.

The first insulating layer and the second insulating layer may include a material selected from the group consisting of silicon oxynitride (SiON) and silicon nitride (SiN).

The germanium layer may include a low-temperature germanium layer and a high-temperature germanium layer.

The etching the single-crystallized silicon layer may include etching the single-crystallized silicon layer to expose the bulk silicon substrate and the cladding material.

The etching the single-crystallized silicon layer may further include etching a top surface of the single-crystallized silicon layer in a sawtooth pattern.

The method may further include surrounding the single-crystallized silicon layer and the germanium layer with a cladding material.

The cladding material may have a lower refractive index than silicon.

The cladding material may include an oxide.

The single-crystallized silicon layer may be formed by forming an amorphous silicon layer and single-crystallizing the amorphous silicon layer.

According to other embodiments of the present invention, there is provided a photodetector structure including a bulk silicon substrate including a trench formed therein filled with a cladding material, a single-crystallized silicon layer formed on the bulk silicon substrate, and a germanium layer formed on the single-crystallized silicon layer.

The single-crystallized silicon layer and the germanium layer may be surrounded by a cladding material.

The method may further include an electrode connected to the germanium layer.

The cladding material may have a lower refractive index than silicon.

The cladding material may include an oxide.

According to some embodiments of the present invention, a method of manufacturing a photodetector structure includes forming a trench in a bulk silicon substrate, filling the trench with an oxide to form a buried oxide therein, forming an amorphous silicon layer formed on the bulk silicon substrate and the buried oxide through a deposition process, forming the amorphous silicon layer into a single-crystallized silicon layer through single crystallization, etching the single-crystallized silicon layer such that a part of the single-crystallized silicon layer contacts the bulk silicon substrate and wherein the buried oxide and the bulk silicon substrate are exposed by the etching of the single-crystallized silicon layer and etching a top surface of the single-crystallized silicon layer in a saw tooth pattern. The method further includes forming a dielectric insulating layer on the bulk silicon substrate, the buried oxide and the single-crystallized silicon layer, etching a part of the dielectric insulating layer to form a seed window therein which exposes the single-crystallized silicon layer contacting the bulk silicon substrate, forming a germanium (Ge) layer on the dielectric insulating layer and the seed window, forming an insulating layer on the Ge layer, heating the Ge layer at a high temperature to form a single-crystallized Ge layer, forming an upper cladding layer composed of an oxide surrounding the single-crystallized silicon layer and the single-crystallized Ge layer; and connecting an electrode to the single-crystallized Ge layer.

BRIEF DESCRIPTION OF THE DRAWINGS

Exemplary embodiments of the present invention can be understood in more detail from the following detailed description taken in conjunction with the attached drawings in which:

FIG. 1 is a schematic diagram of an optical communication system according to an exemplary embodiment of the present invention;

FIG. 2 is a diagram of the structure of a photodetector illustrated in FIG. 1;

FIGS. 3A through 3E are cross-sectional views of a photodetector structure according to an exemplary embodiment of the present invention;

FIGS. 4A through 4H are diagrams for explaining a method of manufacturing a photodetector according to an exemplary embodiment of the present invention;

FIGS. 5A through 5H are diagrams for explaining a method of manufacturing a photodetector according to an exemplary embodiment of the present invention;

FIG. 6 is a diagram of a photodetector structure according to an exemplary embodiment of the present invention.

DETAILED DESCRIPTION OF EXEMPLARY EMBODIMENTS

Figure 3B:
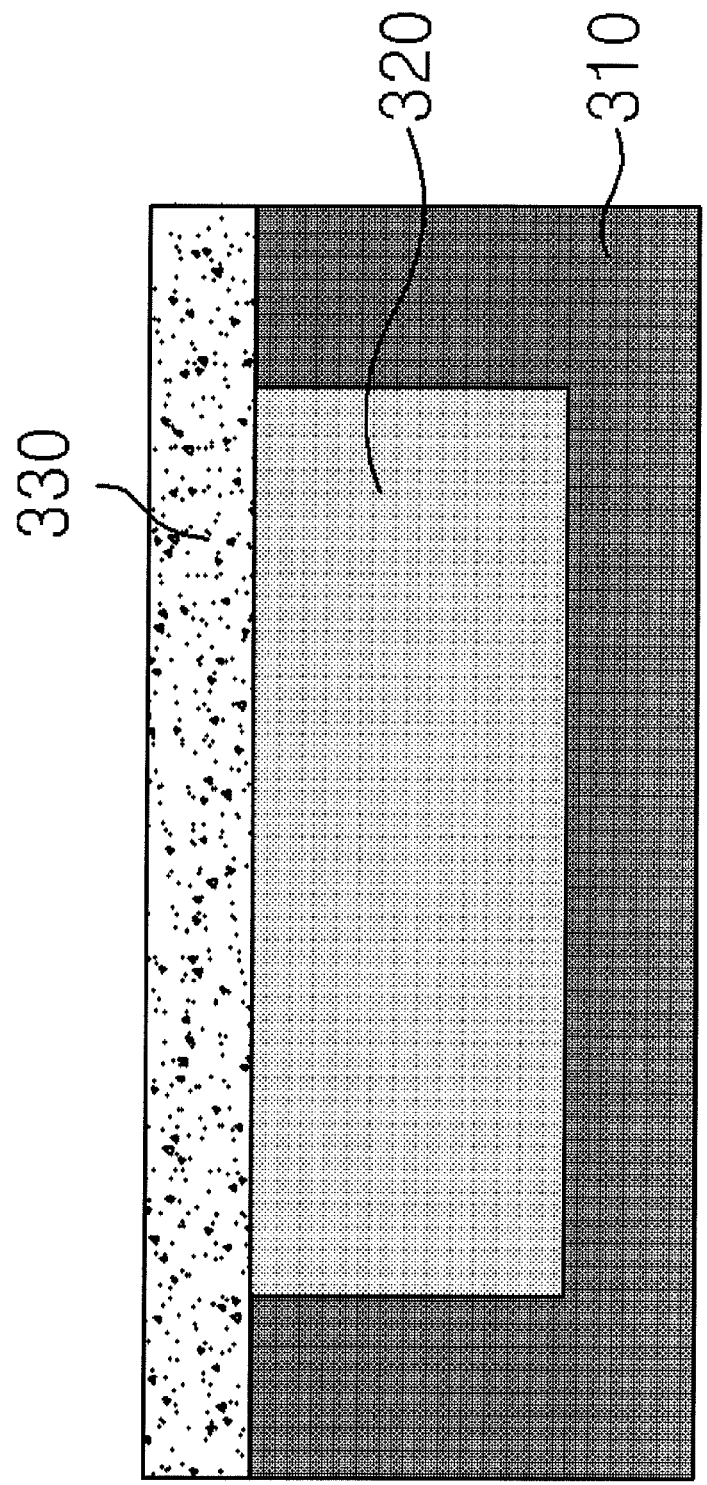

The present invention now will be described more fully hereinafter with reference to the accompanying drawings, in which embodiments of the invention are shown. This invention may, however, be embodied in many different forms and should not be construed as limited to the embodiments set forth herein. In the drawings, the size and relative sizes of layers and regions may be exaggerated for clarity. Like numbers refer to like elements throughout.

FIG. 1 is a schematic diagram of an optical communication system 10 according to some embodiments of the present invention. The optical communication system 10 includes, for example, an optical receiver 100, an optical transmitter 200, and a channel 300.

The optical transmitter 200 converts an electrical signal into an optical signal and transmits the optical signal to the optical receiver 100 through the channel 300. The optical receiver 100 converts the optical signal into an electrical signal. The optical receiver 100 includes a photodetector (PD) 110 and detects the optical signal and converts it into the electrical signal using the PD 110. The channel 300 may be implemented using, for example, an optical fiber.

FIG. 2 is a diagram of the structure of the PD 110 illustrated in FIG. 1. The structure of the PD 110 includes, for example, a first silicon (Si) layer 210, an oxide layer 220, a second Si layer 230, and a germanium (Ge) layer 240, which are sequentially deposited. The oxide layer 220 may be replaced by a layer of any other material that has the lower refractive index than silicon. In addition, the Ge layer 240 may be made of, for example, a single-crystalline Ge layer deposited at low temperature (referred to as a low-temperature Ge layer) and a single-crystalline Ge layer deposited at high temperature (referred to as a high-temperature Ge layer) hereinbelow, but the present invention is not restricted to the current embodiments. For instance, the Ge layer 240 may be made of an alloy of Si and Ge compounded at a necessary ratio or may be made of a single Ge layer instead of the low- and high-temperature Ge layers. Alternatively, the Ge layer 240 may be, for example, a poly crystalline layer, not a single crystalline layer.

The second Si layer 230 functions as an optical waveguide. Incident light travels in a direction of the line B-B' with total reflection and when it reaches the Ge layer 240, it is absorbed by the Ge layer 240. The Ge layer 240 is connected with an electrode although not shown and absorbed light is output as an electrical signal to the electrode.

FIGS. 3A through 3E are cross-sectional views of the structure of the PD 110 according to some embodiments of the present invention. For example, FIGS. 3A through 3E are cross-sectional views of sequential stages of forming the structure of the PD 110, taken along the line A-A' illustrated in FIG. 2.

Referring to FIG. 3A, a trench is made in a bulk Si substrate 310 and is filled with, for example, an oxide to form a buried oxide 320. The buried oxide 320 is used as a lower cladding of an optical waveguide. Although the trench is filled with an oxide in the current embodiment, the present invention is not restricted to the current embodiment. For example, any material having the lower refractive index may be used instead of silicon.

Figure 3C:
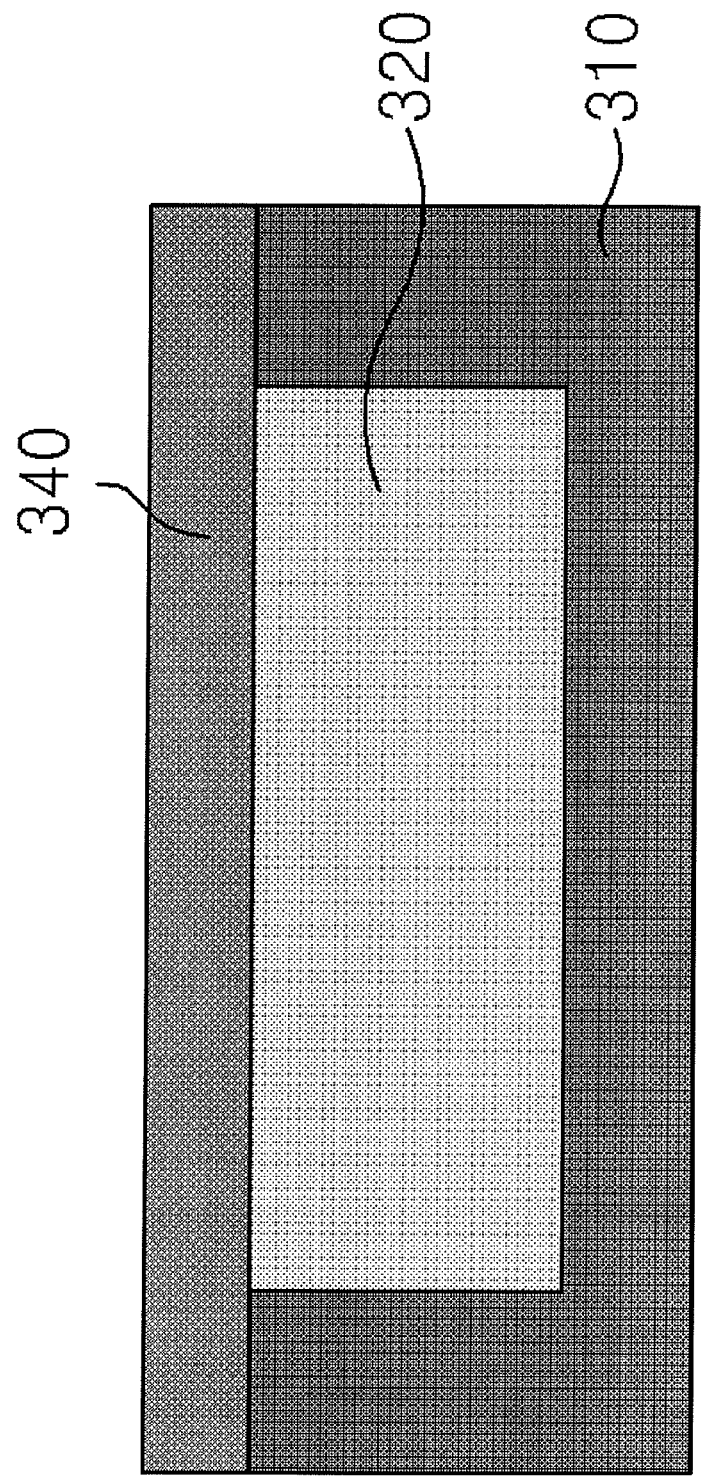

Referring to FIG. 3B, an amorphous Si layer 330 is formed on a structure illustrated in FIG. 3A through a deposition process. Referring to FIG. 3C, the amorphous Si layer 330 is foamed into, for example, a single-crystallized Si layer 340 through single crystallization. The single-crystallized Si layer 340 is used as a core layer of the optical waveguide.

Figure 3D:
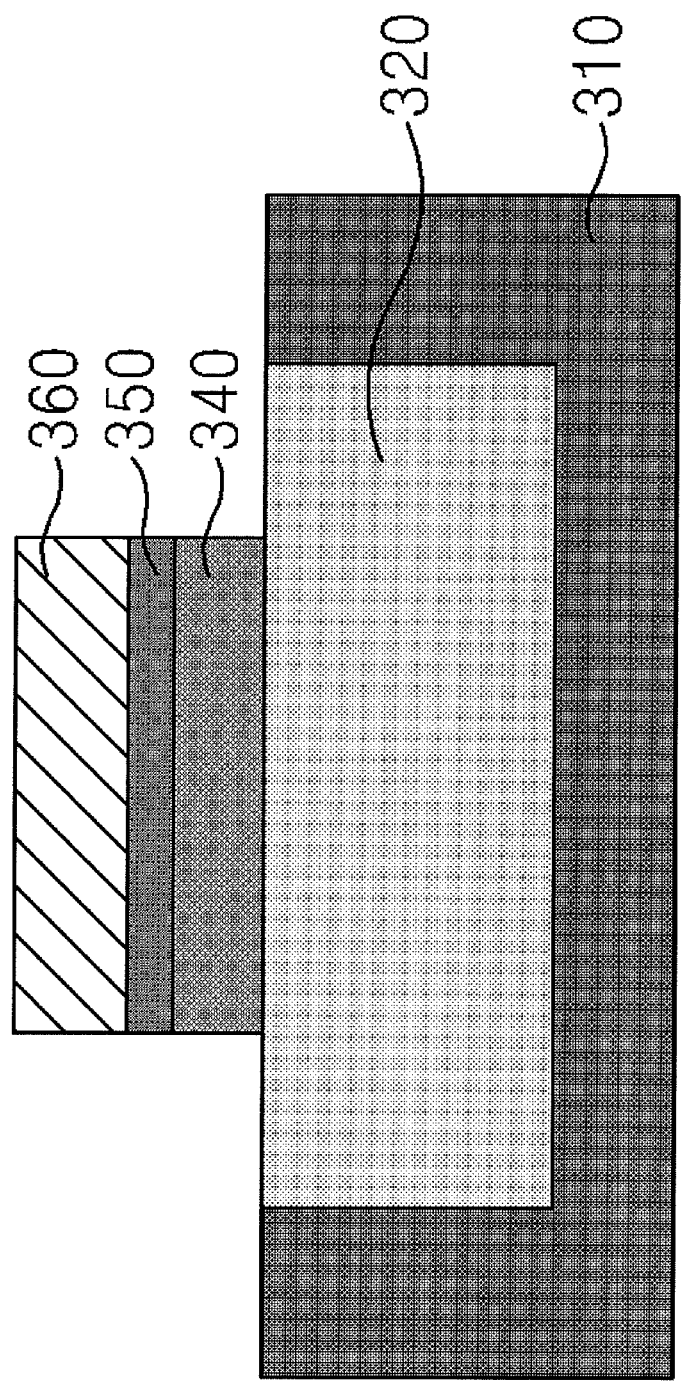

Referring to FIG. 3D, the single-crystallized Si layer 340 is etched by a predetermined portion to form the optical waveguide. For example, a low-temperature Ge layer 350 and a high-temperature Ge-layer 360 are sequentially formed on the single-crystallized Si layer 340.

Figure 3E:
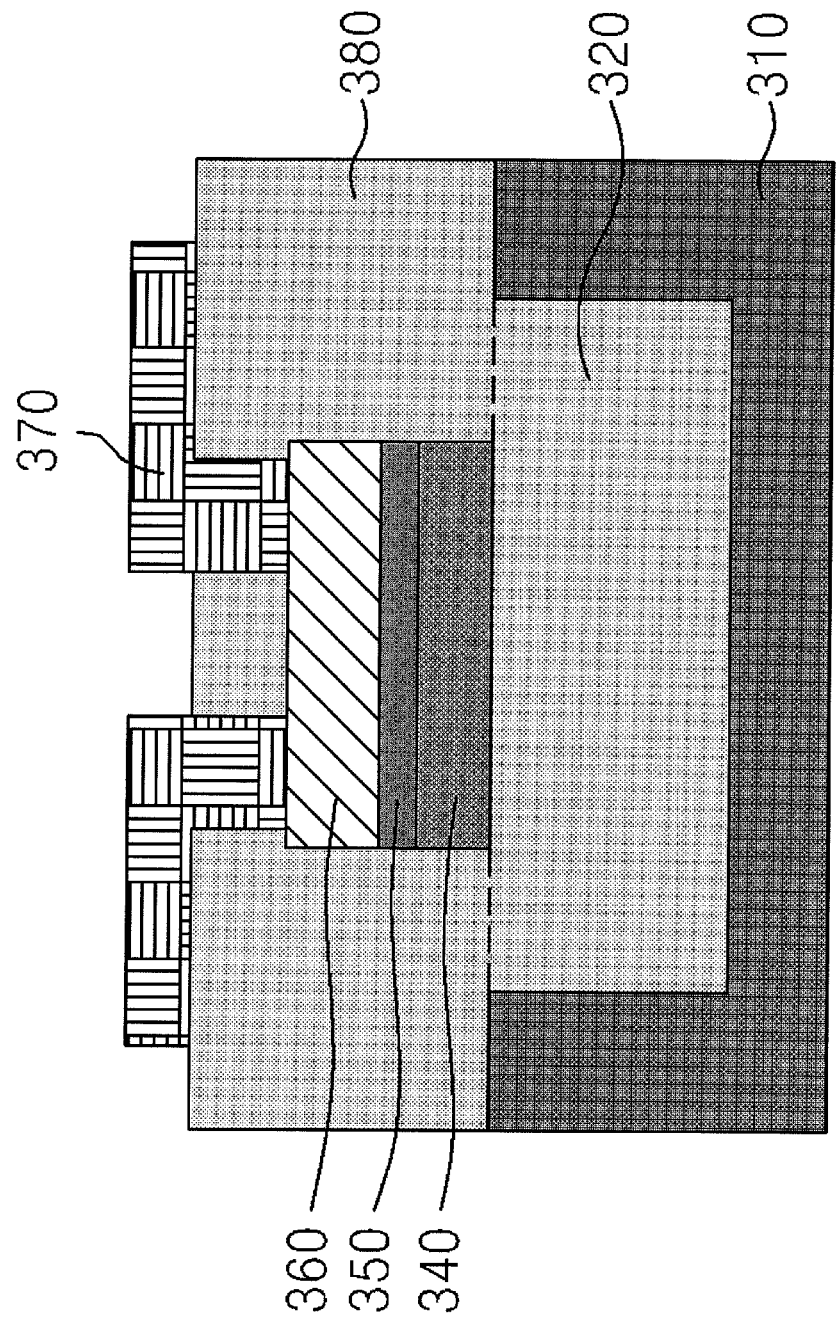

Referring to FIG. 3E, the single-crystallized Si layer 340, the low-temperature Ge layer 350, and the high-temperature Ge-layer 360 are surrounded by, for example, an oxide 380 to form a cladding. An electrode 370 is connected to the low-temperature Ge layer 350 and/or the high-temperature Ge-layer 360, so that light traveling through the optical waveguide with total reflection is output as an electrical signal.

FIGS. 4A through 4H are diagrams for explaining a method of manufacturing the PD 110 according to some embodiments of the present invention. For example, FIGS. 4A through 4H are cross-sectional views of sequential stages of manufacturing the PD 110, taken along the line A-A'.

Figure 4A:
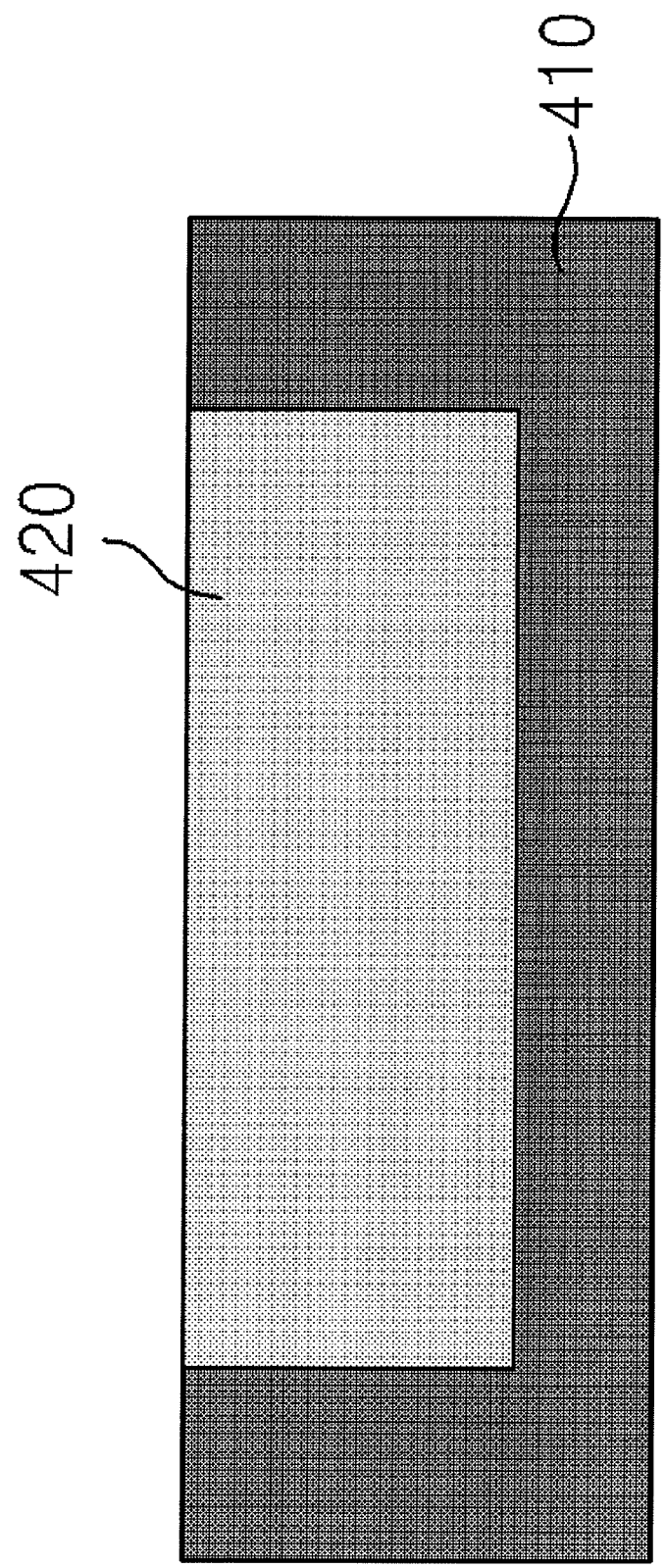

Referring to FIG. 4A, a trench is made in a bulk Si substrate 410 and is filled with, for example, an oxide to form a buried oxide 420. The buried oxide 420 is used as a lower cladding of an optical waveguide.

Figure 4B:
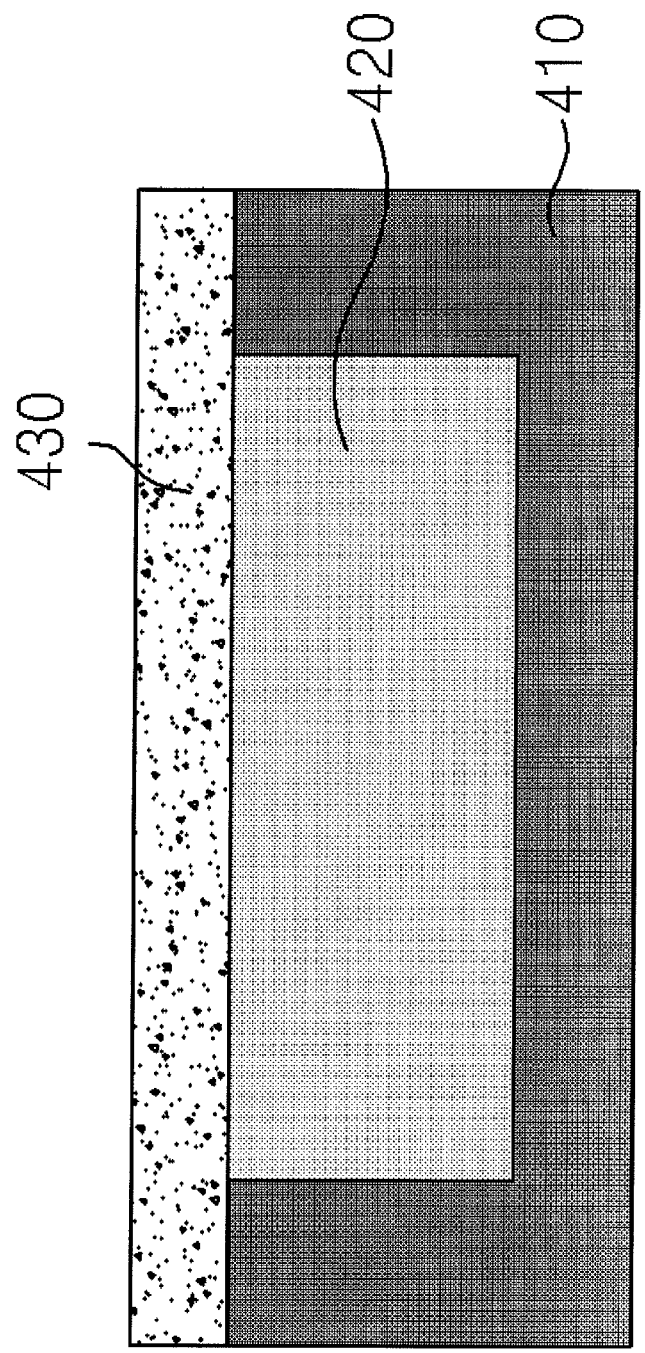
Figure 4C:
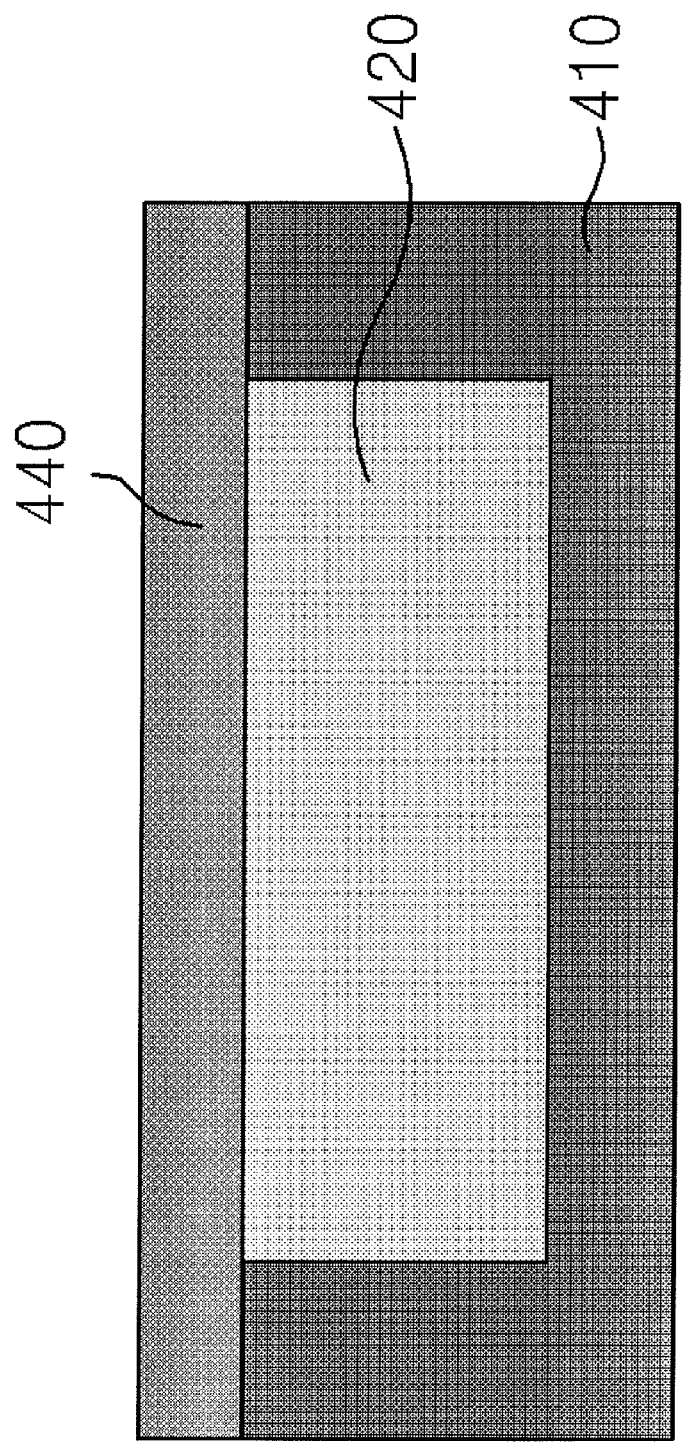

Referring to FIG. 4B, an amorphous Si layer 430 is formed on a structure illustrated in FIG. 4A through a deposition process. Referring to FIG. 4C, the amorphous Si layer 430 is formed into, for example, a single-crystallized Si layer 440 through single crystallization. The single-crystallized Si layer 440 is used as a core layer of the optical waveguide.

Figure 4D:
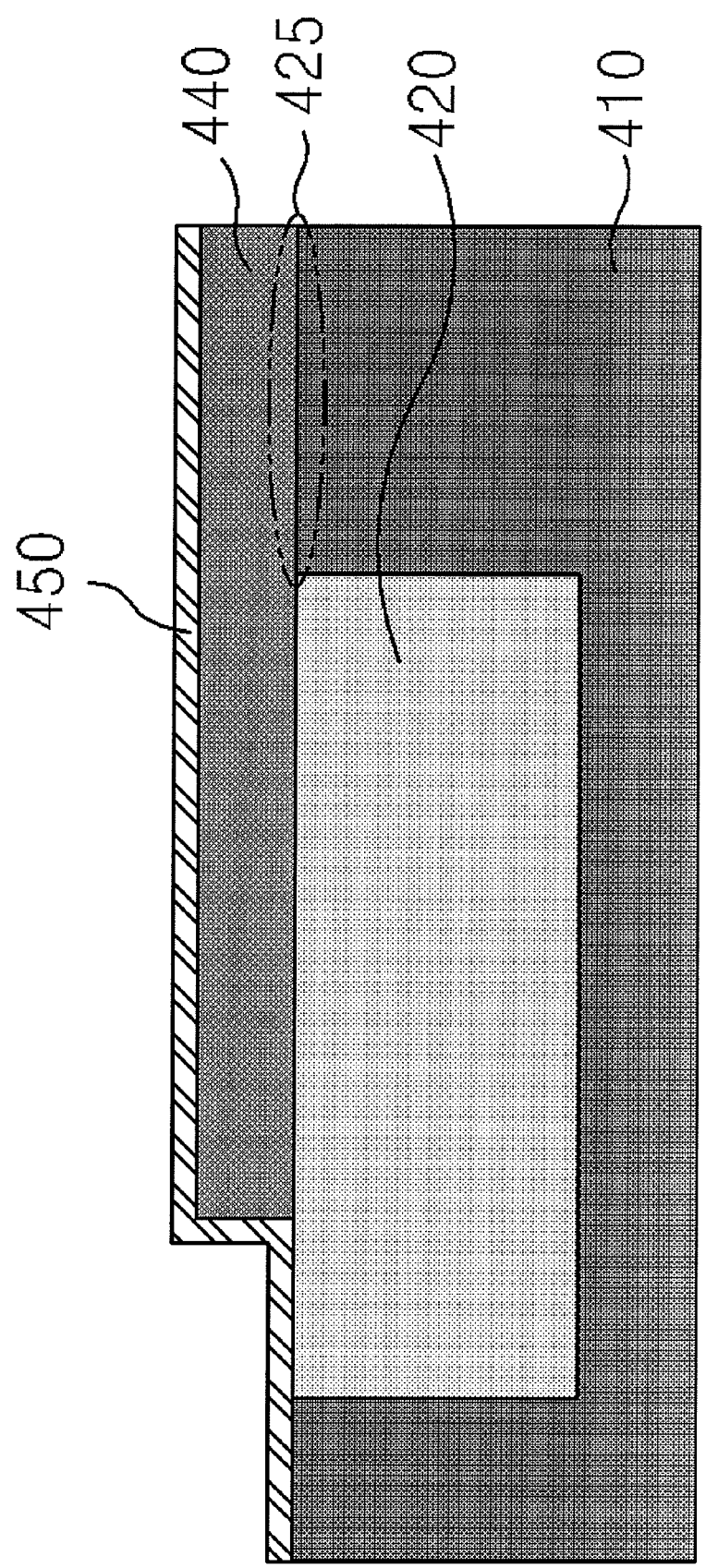

Referring to FIG. 4D, the single-crystallized Si layer 440 is etched by a predetermined portion. At this time, a part of the single-crystallized Si layer 440 should contact the bulk Si substrate 410 as shown in a circle 425. The bulk Si substrate 410 and the buried oxide 420 may be exposed by, for example, etching the single-crystallized Si layer 440. Thereafter, a dielectric insulating layer 450 is thinly formed on the bulk Si substrate 410, the buried oxide 420, and the single-crystallized Si layer 440. At this time, the dielectric insulating layer 450 may be made of, for example, silicon oxynitride (SiON) or silicon nitride (SiN), but the present invention is not restricted thereto.

Figure 4E:
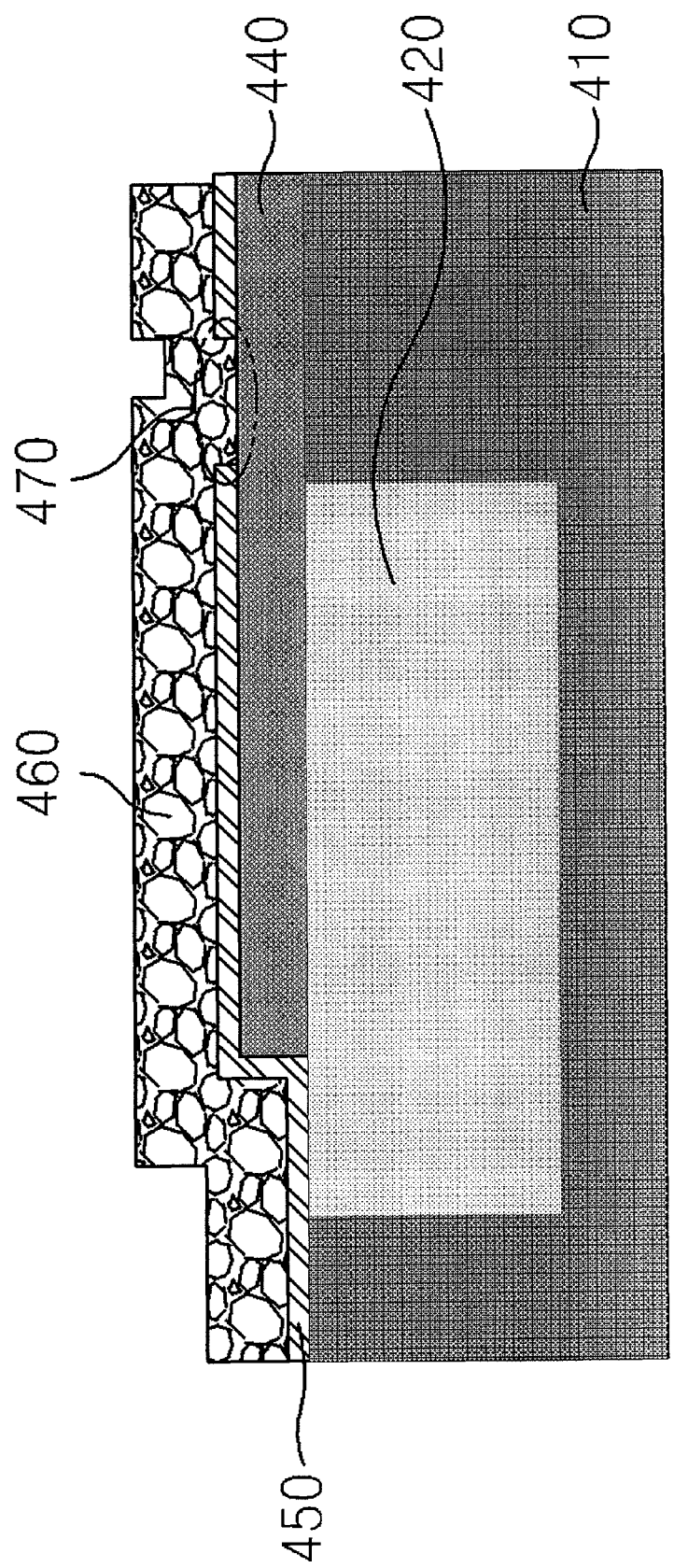

For example, referring to FIG. 4E, a part of the dielectric insulating layer 450 is etched to expose the single-crystallized Si layer 440 contacting the bulk Si substrate 410, thereby forming a seed window 470. A Ge layer 460 is entirely formed on the dielectric insulating layer 450 and the seed window 470. At this time, the Ge layer 460 may be formed by, for example, sequentially forming a low-temperature Ge layer and a high-temperature Ge layer on the dielectric insulating layer 450 and the seed window 470.

Referring to FIG. 4F, etching is performed to form the optical waveguide, so that the optical waveguide and the seed window 470 remain. Thereafter, an insulating layer 480 is formed on the Ge layer 460.

Referring to FIG. 4G, the Ge layer 460 is heated at high temperature to form a single-crystallized Ge layer 460'. Referring to FIG. 4H, an upper cladding 490 is formed using, for example, an oxide and an electrode 500 is formed on the single-crystallized Ge layer 460', so that a PD structure can be obtained.

FIGS. 5A through 5H are cross-sectional views of sequential stages in a method of manufacturing the PD 110, taken along the line A-A', according to other embodiments of the present invention.

Figure 5A:
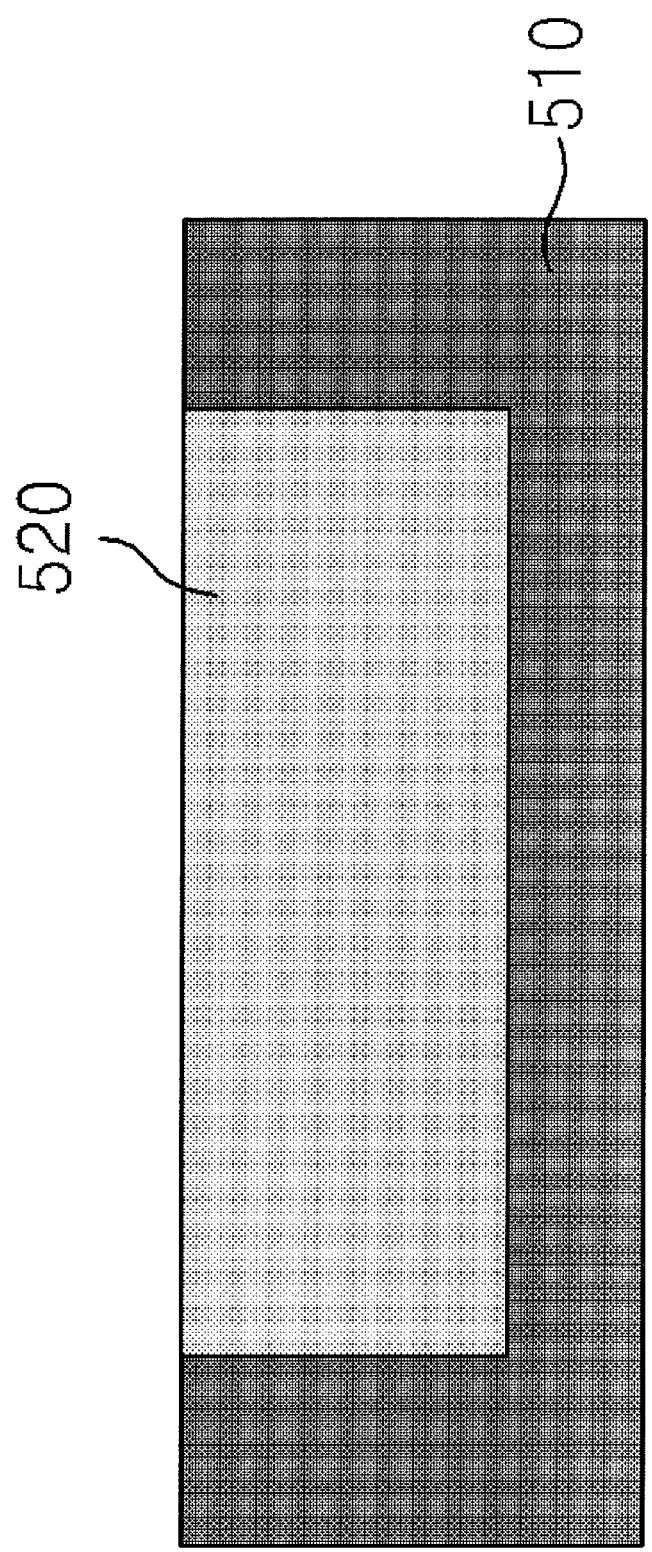

Referring to FIG. 5A, a trench is made in a bulk Si substrate 510 and is filled with, for example, an oxide to form a buried oxide 520. The buried oxide 520 is used as a lower cladding of an optical waveguide.

Figure 5B:
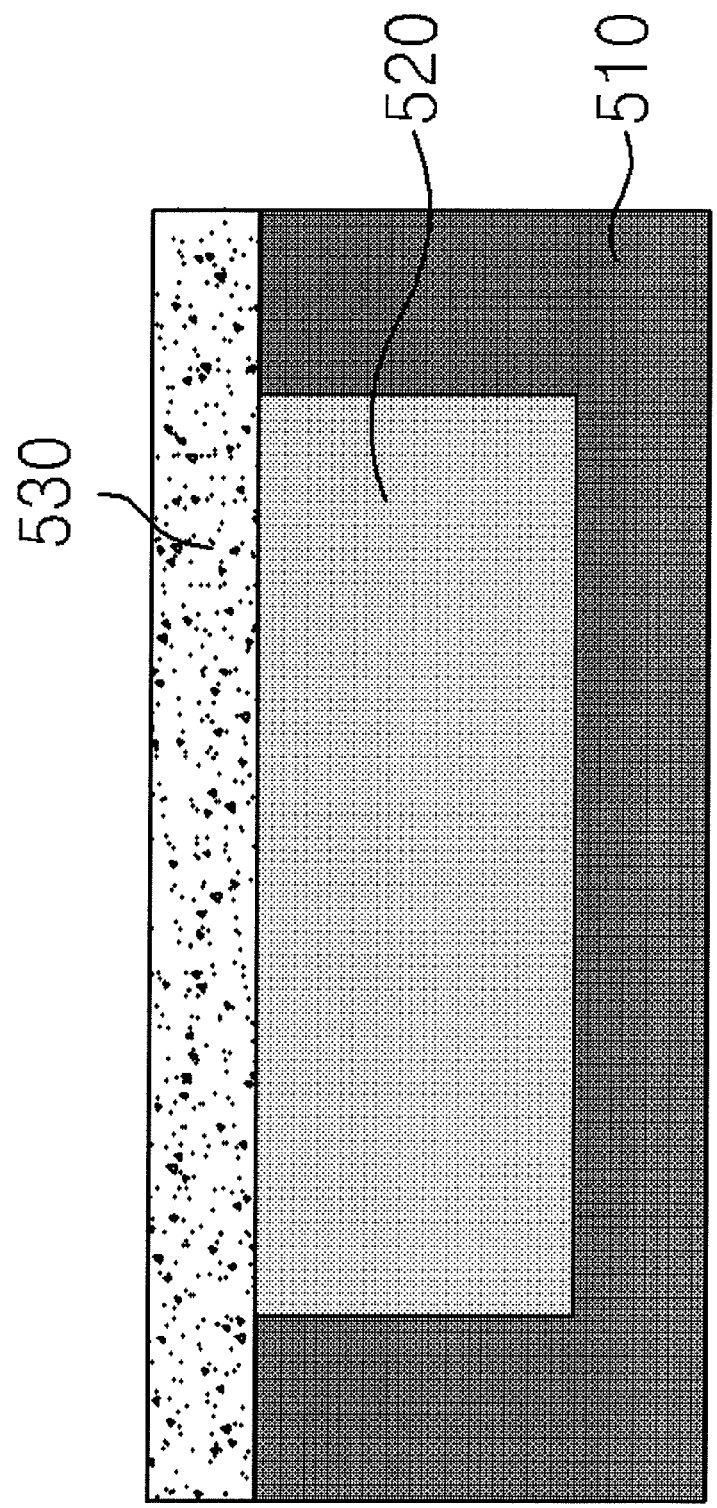
Figure 5C:
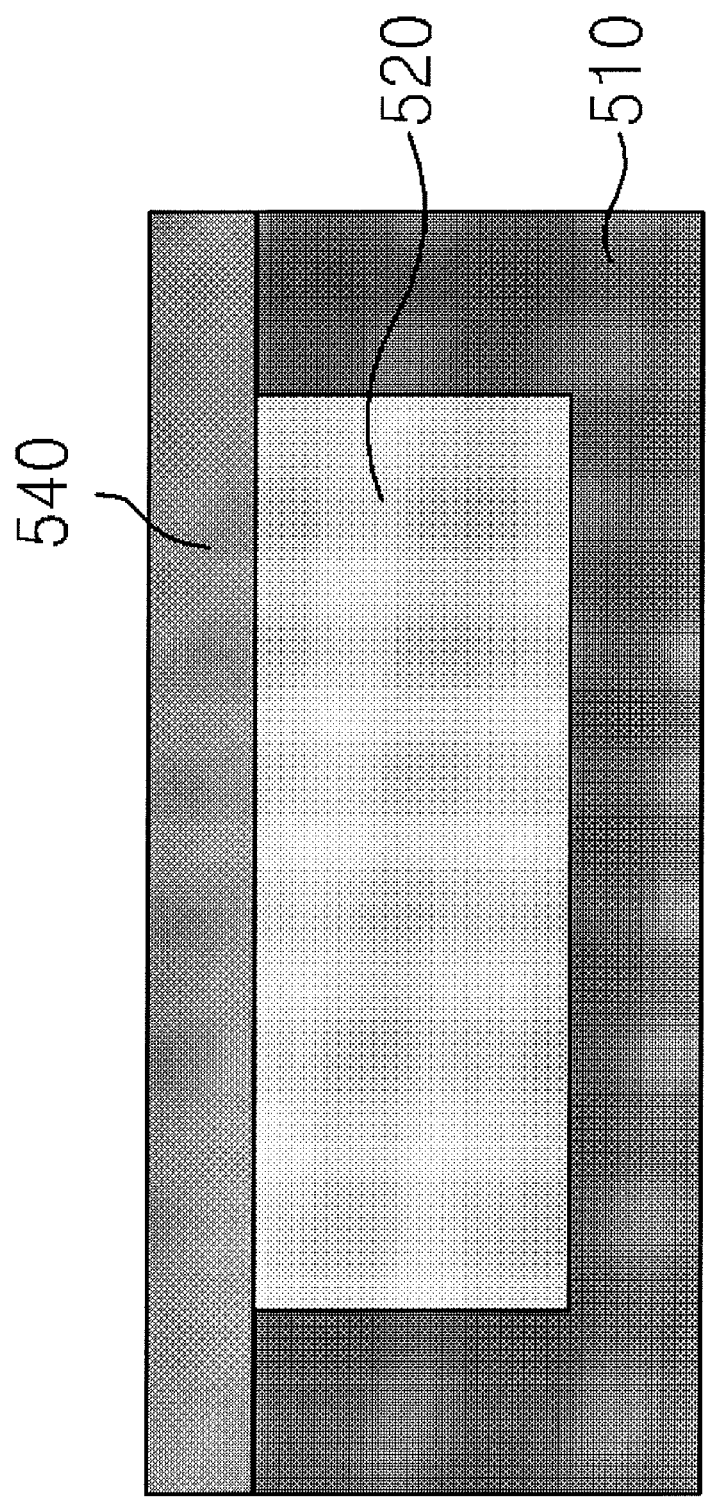

Referring to FIG. 5B, an amorphous Si layer 530 is formed on a structure illustrated in FIG. 5A through a deposition process. Referring to FIG. 5C, the amorphous Si layer 530 is formed into a single-crystallized Si layer 540 through, for example, single crystallization. The single-crystallized Si layer 540 is used as a core layer of the optical waveguide.

Figure 5D:
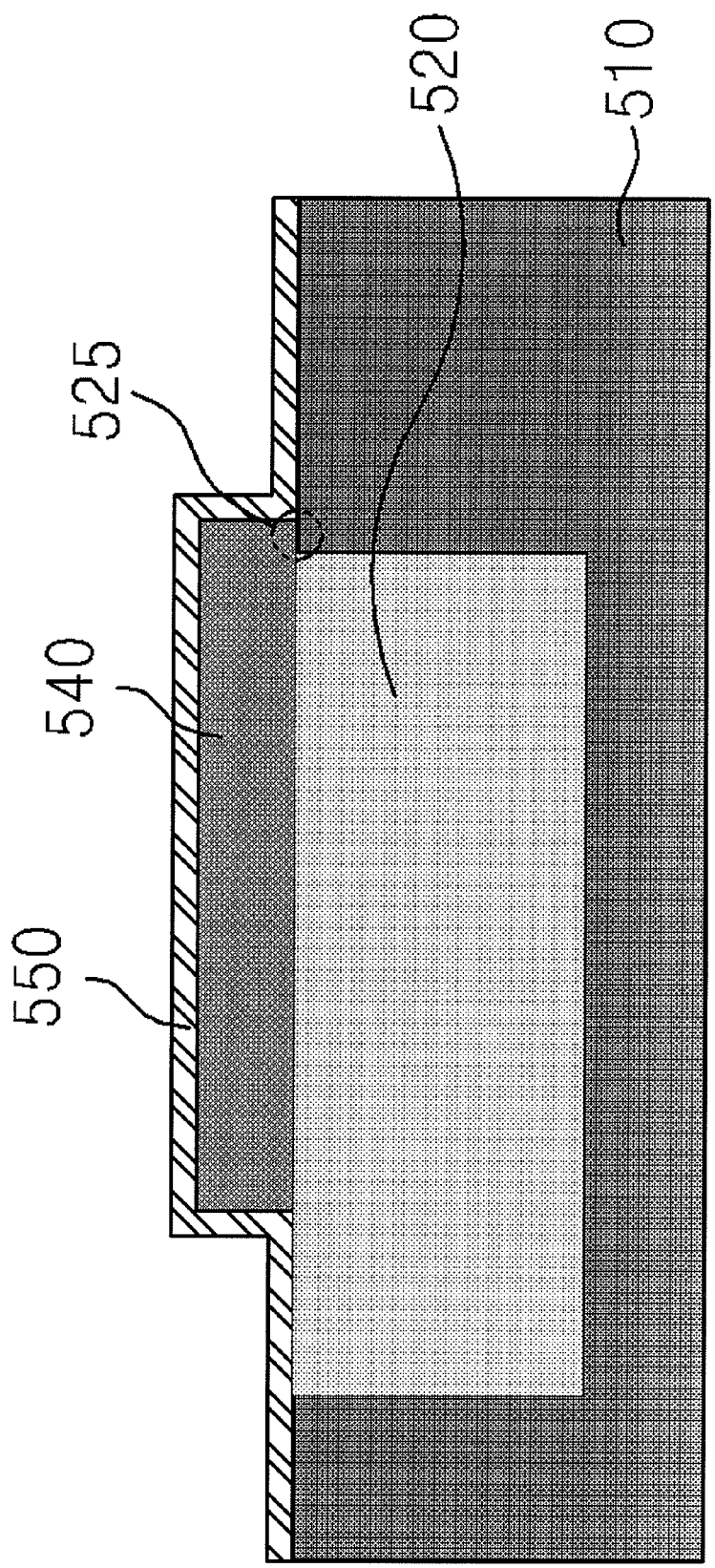

Referring to FIG. 5D, the single-crystallized Si layer 540 is etched by a predetermined portion. At this time, a part of the single-crystallized Si layer 540 should contact the bulk Si substrate 510 as shown in a circle 525. The bulk Si substrate 510 and the buried oxide 520 may be exposed by, for example, etching the single-crystallized Si layer 540. Thereafter, a dielectric insulating layer 550 is thinly formed on the bulk Si substrate 510, the buried oxide 520, and the single-crystallized Si layer 540. At this time, the dielectric insulating layer 550 may be made of, for example, SiON or SiN, but the present invention is not restricted thereto.

Figure 5E:
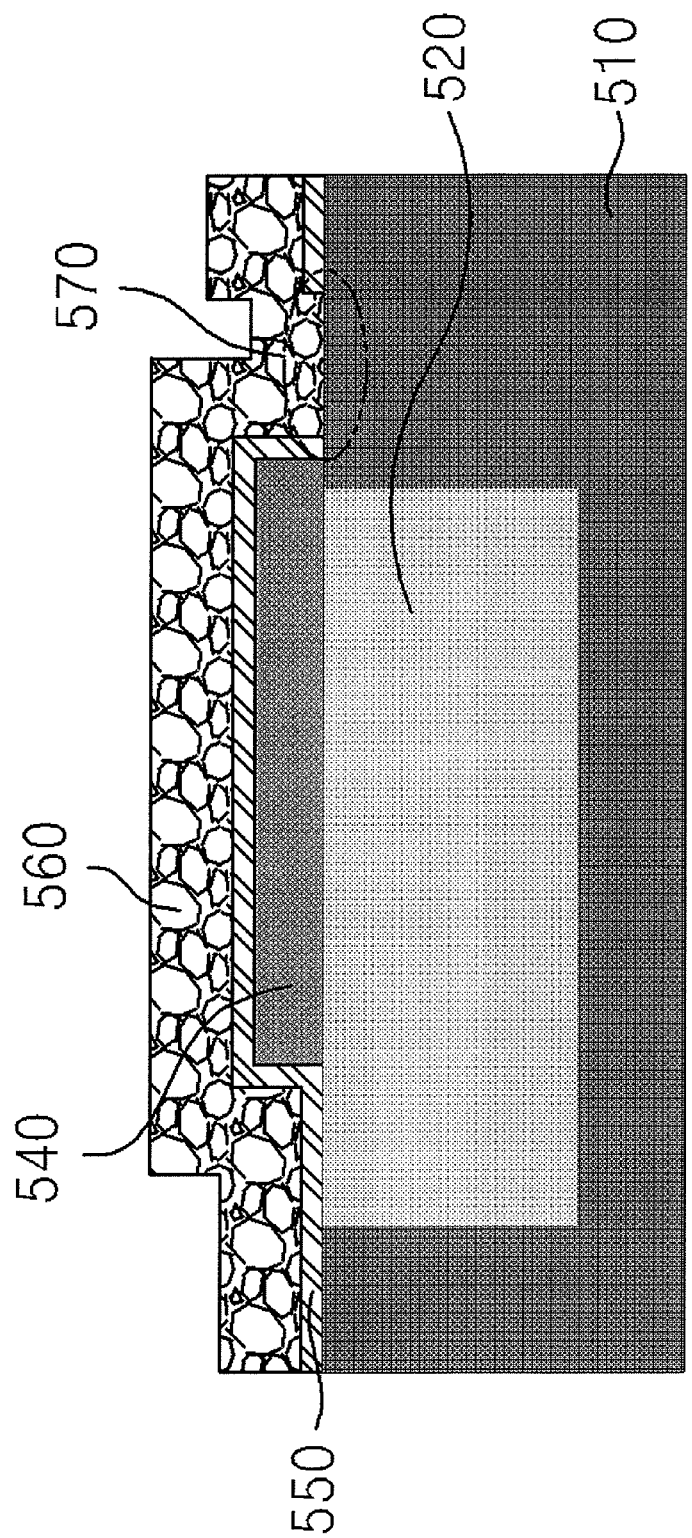

For example, referring to FIG. 5E, a part of the dielectric insulating layer 550 is etched to expose the bulk Si substrate 510, thereby forming a window 570. A Ge layer 560 is entirely formed on the dielectric insulating layer 550 and the window 570. At this time, the Ge layer 560 may be formed by, for example, sequentially forming a low-temperature Ge layer and a high-temperature Ge layer on the dielectric insulating layer 550 and the window 570.

Referring to FIG. 5F, etching is performed to form the optical waveguide, so that the optical waveguide and the window 570 remain. Thereafter, an insulating layer 580 is formed on the Ge layer 560.

Figure 5G:
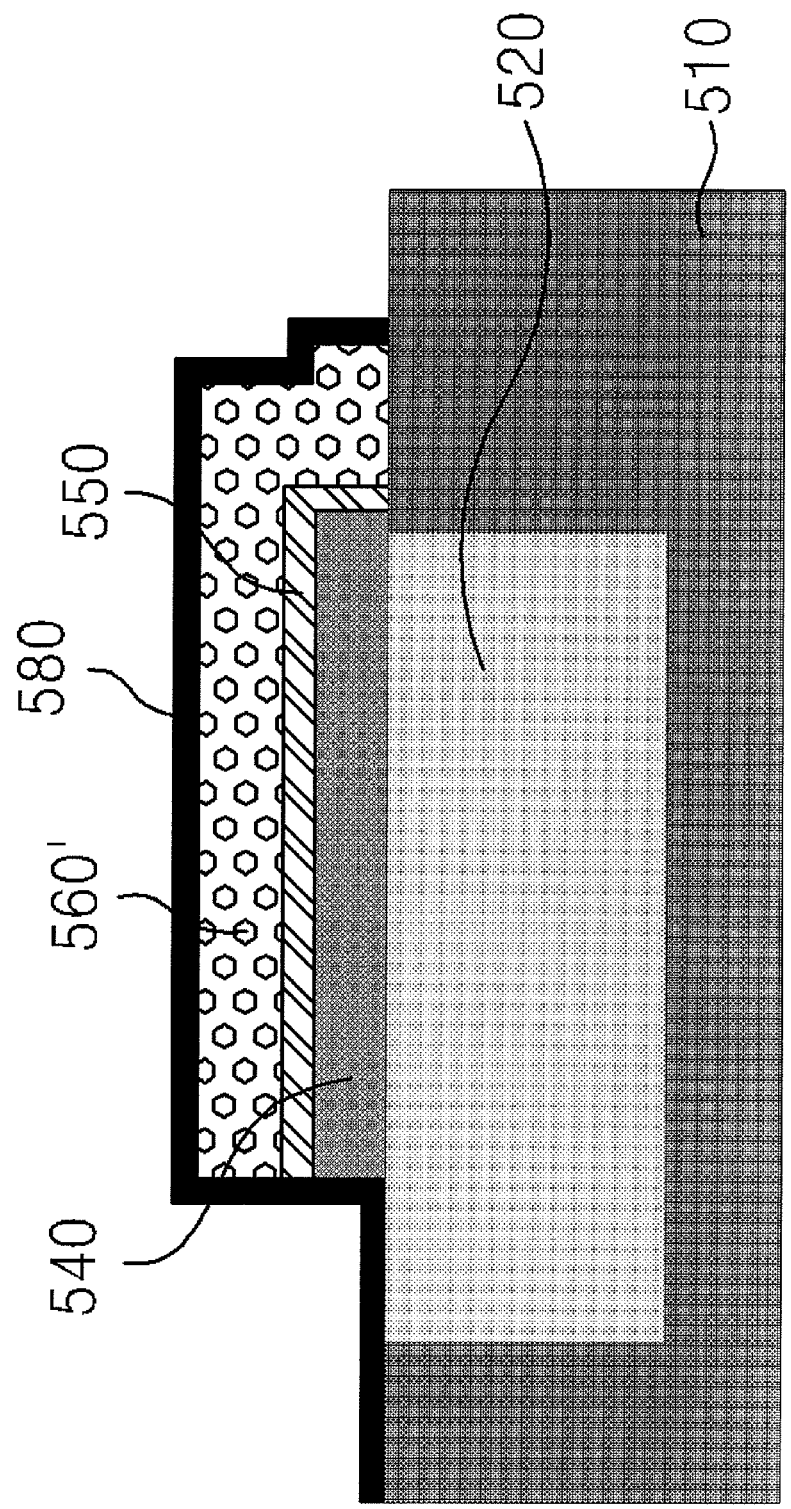
Figure 5H:
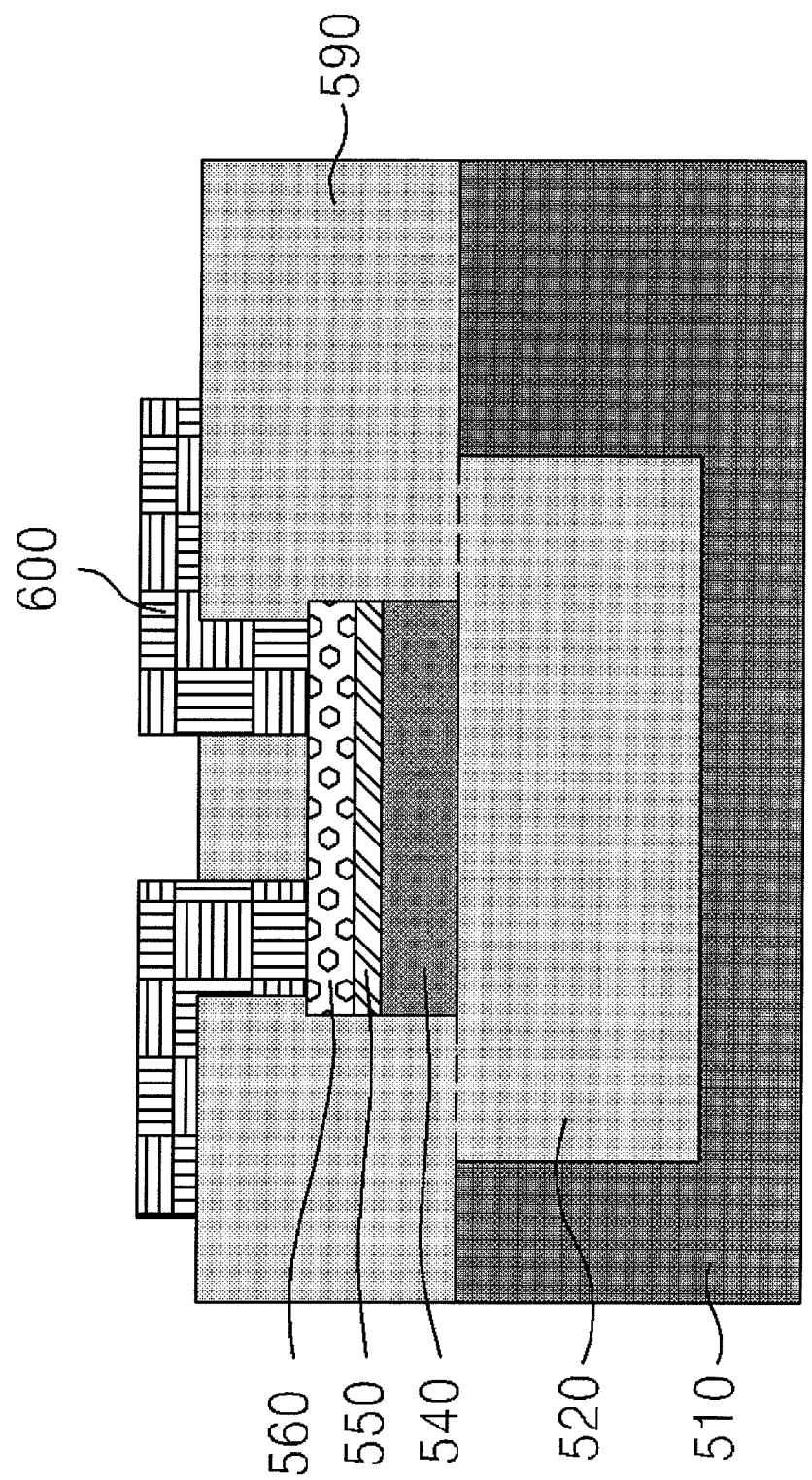

Referring to FIG. 5G, the Ge layer 560 is heated at high temperature to form a single-crystallized Ge layer 560'. Referring to FIG. 5H, an upper cladding 590 is formed using, for example, an oxide and an electrode 600 is formed on the single-crystallized Ge layer 560'.

FIG. 6 is a diagram of a PD structure according to some embodiments of the present invention. For example, FIG. 6 is a cross-section view of the PD structure taken along the line B-B' shown in FIG. 2. The PD structure illustrated in FIG. 6 will be described based on the method illustrated in FIGS. 5A through 5H, but it is apparent that it can also be described based on the method illustrated in FIGS. 4A through 4H. After the single-crystallized Si layer 540 (or 440) is formed, it may be etched in, for example, a sawtooth pattern using a mask, as illustrated in FIG. 6.

With the sawtooth pattern in the single-crystallized Si layer 540, light traveling along the optical waveguide in an arrow-headed direction in FIG. 6 is more readily drawn to the electrode 600. As a result, an optical waveguide shorter than conventional ones can be manifested.

Figure 7:
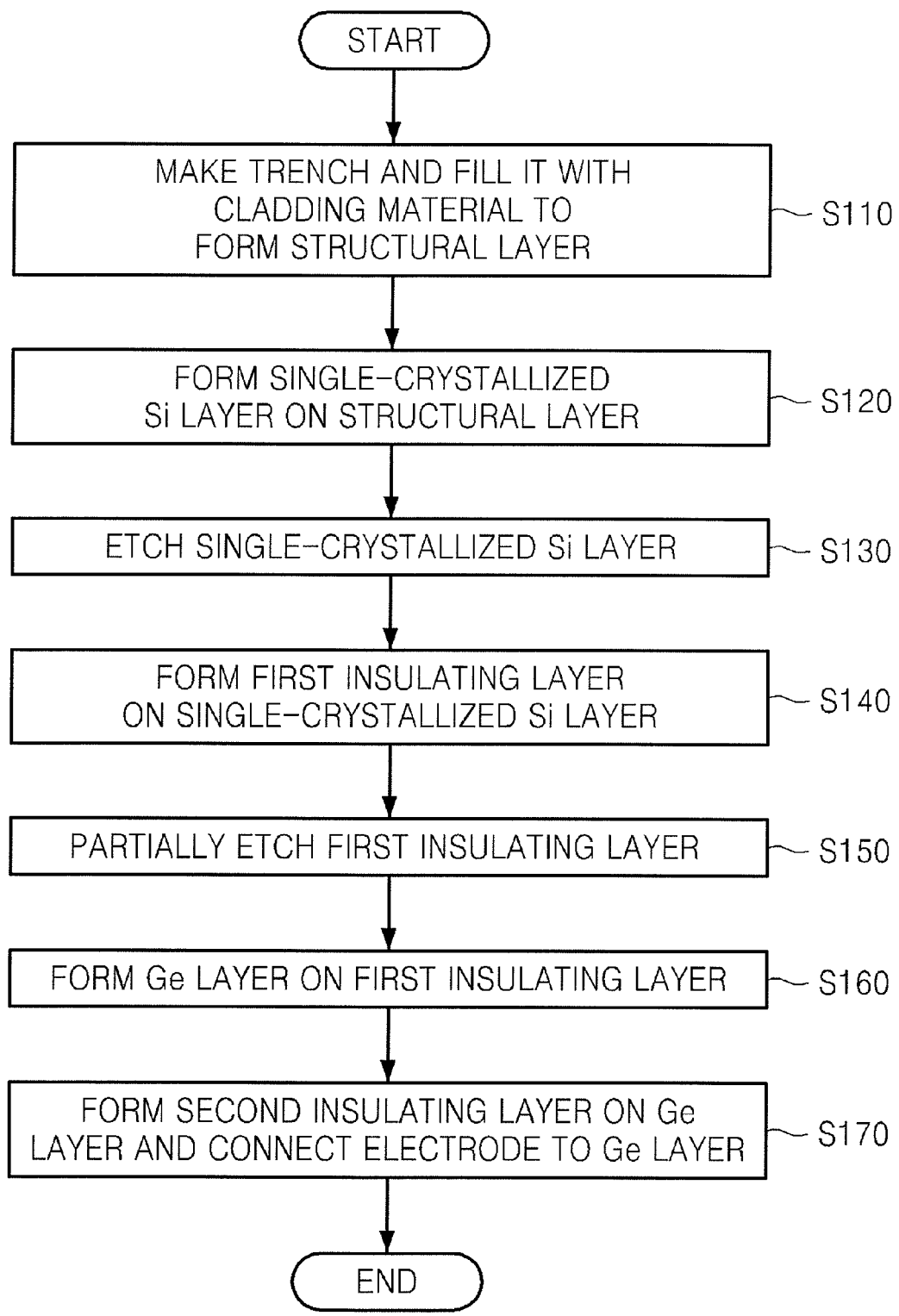
FIG. 7 is a flowchart of a method of manufacturing a photodetector structure according to an exemplary embodiment of the present invention.

FIG. 7 is a flowchart of a method of manufacturing a PD structure according to some embodiments of the present invention. The PD structures illustrated in FIGS. 3A through 5H can be formed using the method illustrated in FIG. 7.

A trench is made in a bulk Si substrate and is filled with a cladding material to form a structural layer in operation S110. The cladding material is a material, e.g., oxide, which has the lower refractive index than silicon.

Thereafter, a single-crystallized Si layer is formed on the structural layer in operation S120. At this time, the single-crystallized Si layer may be formed by, for example, forming an amorphous Si layer and single-crystallizing the amorphous Si layer.

Thereafter, the single-crystallized Si layer is etched in operation S130. At this time, a part of the single-crystallized Si layer contacts the bulk Si substrate of the structural layer and the bulk Si substrate and the cladding material may be exposed through the etching. In addition, the top surface of the single-crystallized Si layer may be formed, for example, in a sawtooth pattern through the etching.

Thereafter, a first insulating layer is formed on the single-crystallized Si layer in operation S140. The first insulating layer may include, for example, SiON or SiN.

Thereafter, the first insulating layer is partially etched in operation S150. At this time, the single-crystallized Si layer contacting the bulk Si substrate or the bulk Si substrate may be exposed through the etching, so that bulk Si is used as a seed for crystallization of a Ge layer.

Thereafter, a Ge layer is formed on the first insulating layer in operation S160. A second insulating layer is formed on the Ge layer and an electrode is connected to the Ge layer in operation S170. At this time, the second insulating layer may include, for example, SiON or SiN and the Ge layer may include, for example, a low-temperature Ge layer and a high-temperature Ge layer.

As described above, unlike silicon-on-insulator (SOI) based PDs, a PD manufactured using a bulk Si substrate can be integrated into one substrate together with a complementary metal-oxide semiconductor (CMOS) integrated circuit (IC). In addition, bulk Si is used as a seed for crystallization of a Ge layer, and therefore, the Ge layer with better light absorptance can be obtained.

According to some embodiments of the present invention, treading dislocation density is lowered below a standard and a PD structure can be integrated into one substrate together with CMOS ICs, thereby increasing economical efficiency.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a photodetector structure, the method comprising:
   forming a structural layer by making a trench in a bulk silicon substrate and filling the trench with a cladding material;
   forming a single-crystallized silicon layer on the structural layer; and
   forming a germanium layer on the single-crystallized silicon layer, wherein the germanium layer comprises a low-temperature germanium layer and a high-temperature germanium layer, wherein the forming the germanium layer comprises:
   forming a first insulating layer on the single-crystallized silicon layer, and
   forming the germanium layer on the first insulating layer;
   etching the single-crystallized silicon layer before forming the first insulating layer on the single-crystallized silicon layer, wherein the etched single-crystallized silicon layer partially contacts the bulk silicon substrate of the structural layer; and
   forming a seed window by partially etching the first insulating layer to expose the single-crystallized silicon layer contacting the bulk silicon substrate after forming the first insulating layer.

2. The method of claim 1, further comprising:
   forming a second insulating layer on the germanium layer; and
   connecting an electrode to the germanium layer.

3. The method of claim 2, wherein the first insulating layer and the second insulating layer comprise a material selected from the group consisting of silicon oxynitride (SiON) and silicon nitride (SiN).

4. The method of claim 2, further comprising surrounding the single-crystallized silicon layer and the germanium layer with a cladding material.

5. The method of claim 4, wherein the cladding material has a lower refractive index than silicon.

6. The method of claim 5, wherein the cladding material comprises an oxide.

7. A method of manufacturing a photodetector structure, the method comprising:
   forming a structural layer by making a trench in a bulk silicon substrate and filling the trench with a cladding material;
   forming a single-crystallized silicon layer on the structural layer; and
   forming a germanium layer on the single-crystallized silicon layer, wherein the germanium layer comprises a low-temperature germanium layer and a high-temperature germanium layer, wherein the forming the germanium layer comprises:
   forming a first insulating layer on the single-crystallized silicon layer, and
   forming the germanium layer on the first insulating layer;
   etching the single-crystallized silicon layer before forming the first insulating layer on the single-crystallized silicon layer, wherein the etched single-crystallized silicon layer partially contacts the bulk silicon substrate of the structural layer; and
   forming a window by partially etching the first insulating layer to expose the bulk silicon substrate after forming the first insulating layer.

8. A method of manufacturing a photodetector structure, the method comprising:
   forming a structural layer by making a trench in a bulk silicon substrate and filling the trench with a cladding material;
   forming a single-crystallized silicon layer on the structural layer;
   etching the single-crystallized silicon layer, wherein the etched single-crystallized silicon layer partially contacts the bulk silicon substrate of the structural layer;
   forming a first insulating layer on the etched single-crystallized silicon layer; and
   forming a germanium layer on the first insulating layer,
   wherein the etching the single-crystallized silicon layer comprises etching the single-crystallized silicon layer to expose the bulk silicon substrate and the cladding material.

9. The method of claim 8, wherein the etching the single-crystallized silicon layer further comprises etching a top surface of the single-crystallized silicon layer in a sawtooth pattern.

10. A method of manufacturing a photodetector structure, the method comprising:
    forming a trench in a bulk silicon substrate;
    filling the trench with an oxide to form a buried oxide therein;
    forming an amorphous silicon layer on the bulk silicon substrate and the buried oxide through a deposition process;
    forming the amorphous silicon layer into a single-crystallized silicon layer through single crystallization;
    etching the single-crystallized silicon layer such that a part of the single-crystallized silicon layer contacts the bulk silicon substrate and wherein the buried oxide and the bulk silicon substrate are exposed by the etching of the single-crystallized silicon layer and etching a top surface of the single-crystallized silicon layer in a saw tooth pattern;
    forming a dielectric insulating layer on the bulk silicon substrate, the buried oxide and the single-crystallized silicon layer;
    etching a part of the dielectric insulating layer to form a seed window therein which exposes the single-crystallized silicon layer contacting the bulk Si substrate;
    forming a germanium (Ge) layer on the dielectric insulating layer and the seed window;
    forming an insulating layer on the Ge layer;
    heating the Ge layer at a high temperature to form a single-crystallized Ge layer;
    forming an upper cladding layer composed of an oxide surrounding the single-crystallized silicon layer and the single-crystallized Ge layer; and
    connecting an electrode to the single-crystallized Ge layer.

* * * * *